(12) United States Patent
Kan et al.

(10) Patent No.: US 7,484,159 B2
(45) Date of Patent: Jan. 27, 2009

(54) ENCODING METHOD AND ENCODING APPARATUS

(75) Inventors: Makiko Kan, Tokyo (JP); Takashi Yokokawa, Tokyo (JP); Toshiyuki Miyauchi, Tokyo (JP); Atsushi Kikuchi, Kangawa (JP)

(73) Assignee: Sony Corporation, Tokyo (JP)

( * ) Notice: Subject to any disclaimer, the term of this patent is extended or adjusted under 35 U.S.C. 154(b) by 687 days.

(21) Appl. No.: 11/071,096

(22) Filed: Mar. 3, 2005

(65) Prior Publication Data

US 2005/0204261 A1 Sep. 15, 2005

(30) Foreign Application Priority Data

Mar. 5, 2004 (JP) ............................. 2004-062488

(51) Int. Cl.
*H03M 13/00* (2006.01)
(52) U.S. Cl. ...................................... 714/755; 714/786
(58) Field of Classification Search ................. 714/755, 714/785–786, 781
See application file for complete search history.

(56) References Cited

U.S. PATENT DOCUMENTS

| | | | | |
|---|---|---|---|---|
| 5,479,416 | A * | 12/1995 | Snodgrass et al. ........... | 714/785 |
| 2003/0212945 | A1 * | 11/2003 | Sundaram et al. ........... | 714/781 |
| 2006/0015791 | A1 * | 1/2006 | Kikuchi et al. .............. | 714/758 |

OTHER PUBLICATIONS

K. Andrews et al.: "Encoders for Block-Circulant LDPC Codes", 'Online! Feb. 14, 2005, pp. 1-5.

T.J. Richardson et al.: "Efficient encoding of low-density parity-check codes"; IEEE Transcations on Infomation Theory, IEEE Service Center, vol. 47, No. 2, Feb. 2001.

T. Okamura; "Designing ldpc codes using cyclic shifts"; Proceedings 2003 IEEE International Symposium on Information Theory. ISIT 03. Yokohama, Japan; Jun. 29-jul. 4, 2003, IEEE International Symposium on Information Theory, New York, NY: IEEE, US Jun. 29, 2003, p. 151.

A. Sridharan et al.; "A construction for low density parity check convolutional codes based on quasi-cyclic block codes"; Proceedings 2002 IEEE International Symposium on Information Theory. ISIT 02 Lausanne, Switzerland, Jun. 30-Jul. 5, 2002, IEEE International Symposium on Information Theory, New York, NY: IEEE, US, Jun. 30, 2002 pp. 481.

R. Smarandache et al.; "On Regular Quasi-Cyclic LDPC Codes from Binomials"; 'Online!; Dec. 1, 2003; pp.1-6.

Li Ping et al., "Low Density Parity Check Codes with Semi-Random Partly Check Matric," *Electronics Letters*, vol. 35(1), Jan. 7th, 1999.

* cited by examiner

*Primary Examiner*—Guy J Lamarre
(74) *Attorney, Agent, or Firm*—Finnegan, Henderson, Farabow, Garrett & Dunner, L.L.P.

(57) ABSTRACT

Disclosed is an apparatus for encoding data into linear codes on a ring R, including: as many shift registers as the length of information input thereto, the shift registers having a plurality of memory elements; a shift adding unit for adding values which are cyclically input depending on a check matrix for the linear codes, from the shift registers; a storage unit for storing parity values of the linear codes; and an accumulative adding unit for adding a sum from the shift adding unit and the parity values of the linear codes stored in the storage unit to each other to determine new parity values of the linear codes, and supplying the new parity values to the storage unit.

8 Claims, 12 Drawing Sheets

FIG.1

$$H_{QC} = \begin{Bmatrix} 11000 & 10100 & 11100 \\ 01100 & 01010 & 01110 \\ 00110 & 00101 & 00111 \\ 00011 & 10010 & 10011 \\ 10001 & 01001 & 11001 \\ & & \\ 10110 & 01100 & 01000 \\ 01011 & 00110 & 00100 \\ 10101 & 00011 & 00010 \\ 11010 & 10001 & 00001 \\ 01101 & 11000 & 10000 \end{Bmatrix}$$

FIG.2

$$H_{IRA} = \begin{Bmatrix} 10100 & 1000000000 \\ 11001 & 1100000000 \\ 10001 & 0110000000 \\ 00110 & 0011000000 \\ 10101 & 0001100000 \\ 10110 & 0000110000 \\ 01011 & 0000011000 \\ 10101 & 0000001100 \\ 11010 & 0000000110 \\ 01001 & 0000000011 \end{Bmatrix}$$

$$\underbrace{\phantom{10100}}_{11} \underbrace{\phantom{1000000000}}_{12}$$

FIG.5

$$H_{QCIRA1} = \begin{pmatrix} \overbrace{\begin{array}{ccc} \boxed{HI_{11}} & \boxed{HI_{12}} & \boxed{HI_{13}} \\ \boxed{HI_{21}} & \boxed{HI_{22}} & \boxed{HI_{23}} \end{array}}^{101} & \overbrace{\boxed{HP}}^{102} \end{pmatrix}$$

$$= \begin{pmatrix} 11000 \; 10100 \; 11100 \; 1000000000 \\ 01100 \; 01010 \; 01110 \; 1100000000 \\ 00110 \; 00101 \; 00111 \; 0110000000 \\ 00011 \; 10010 \; 10011 \; 0011000000 \\ 10001 \; 01001 \; 11001 \; 0001100000 \\ \\ 10110 \; 01100 \; 01000 \; 0000110000 \\ 01011 \; 00110 \; 00100 \; 0000011000 \\ 10101 \; 00011 \; 00010 \; 0000001100 \\ 11010 \; 10001 \; 00001 \; 0000000110 \\ 01101 \; 11000 \; 10000 \; 0000000011 \end{pmatrix}$$

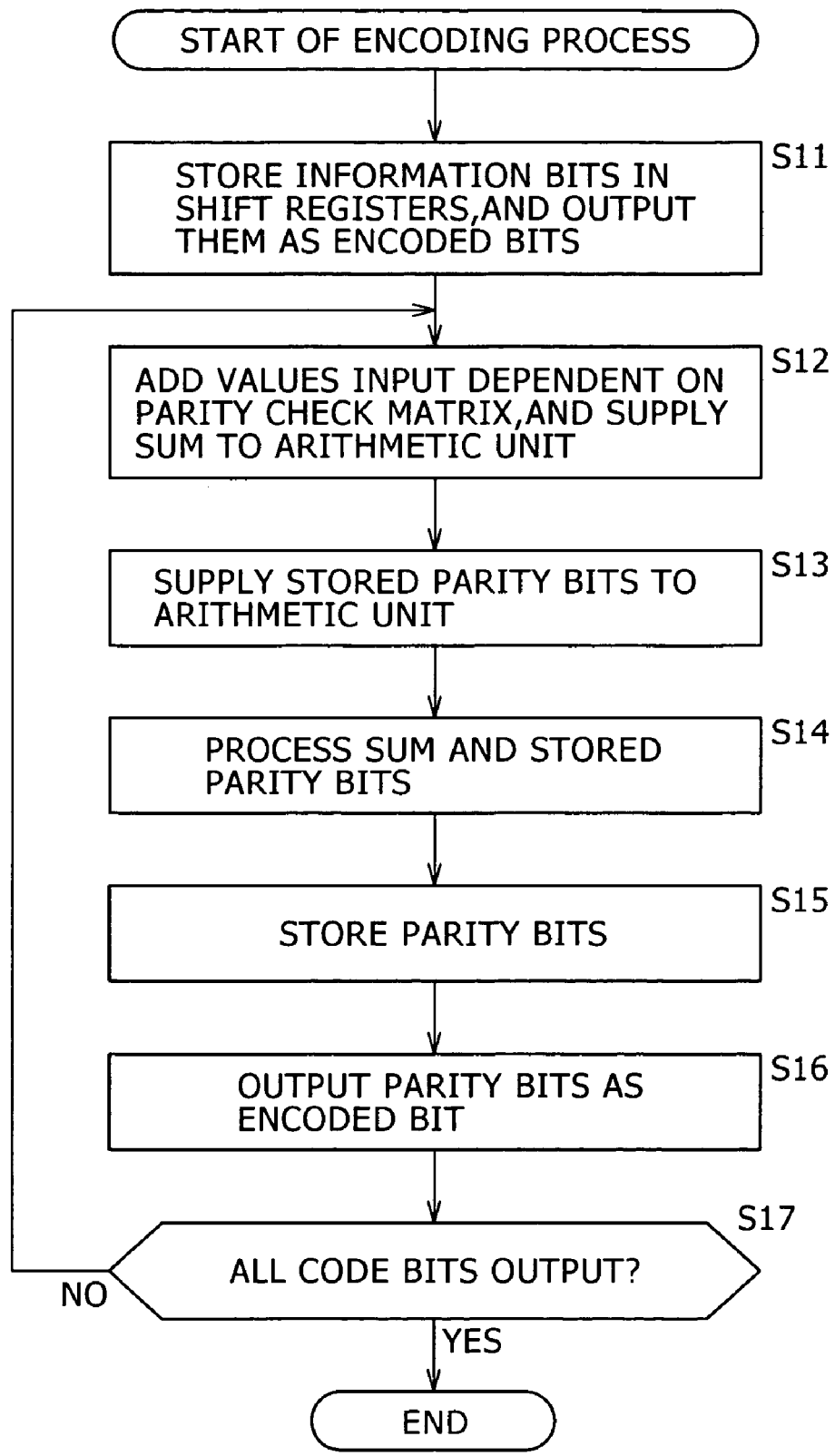

FIG. 8

$$H_{QCIRA2} = \left\{ \overbrace{\boxed{HI_{11}} \quad \boxed{HI_{12}} \quad \boxed{HI_{13}}}^{201} \quad \overbrace{\boxed{HP}}^{202} \right\}$$
$$\phantom{H_{QCIRA2}} \quad \boxed{HI_{21}} \quad \boxed{HI_{22}} \quad \boxed{HI_{23}}$$

$$= \begin{pmatrix}
ab000 & c0d00 & efg00 & h0000000000 \\
0ab00 & 0c0d0 & 0efg0 & ih000000000 \\
00ab0 & 00c0d & 00efg & 0ih00000000 \\
000ab & d00c0 & g00ef & 00ih0000000 \\
b000a & 0d00c & fg00e & 000ih000000 \\
 & & & \\
j0op0 & 0rs00 & 0t000 & 0000ih00000 \\
0j0op & 00rs0 & 00t00 & 00000ih0000 \\
p0j0o & 000rs & 000t0 & 000000ih000 \\
op0j0 & s000r & 0000t & 0000000ih00 \\
0op0j & rs000 & t0000 & 00000000ih
\end{pmatrix}$$

FIG.11

$$H_{QCIRA3} = \left\{ \begin{array}{ccc|cc} \overbrace{\boxed{HI_{11}} \quad \boxed{HI_{12}} \quad \boxed{HI_{13}}}^{301} & \overbrace{\boxed{HP_{11}} \quad \boxed{HP_{12}}}^{302} \\ \boxed{HI_{21}} \quad \boxed{HI_{22}} \quad \boxed{HI_{23}} & \boxed{HP_{21}} \quad \boxed{HP_{22}} \end{array} \right\}$$

$$= \left\{ \begin{array}{ccccc}
ab000 & c0d00 & efg00 & h0000 & 00000 \\
0ab00 & 0c0d0 & 0efg0 & 0h000 & i0000 \\
00ab0 & 00c0d & 00efg & 00h00 & 0i000 \\
000ab & d00c0 & g00ef & 000h0 & 00i00 \\
b000a & 0d00c & fg00e & 0000h & 000i0 \\
\\
j0op0 & 0rs00 & 0t000 & i0000 & z0000 \\
0j0op & 00rs0 & 00t00 & 0i000 & 0z000 \\
p0j0o & 000rs & 000t0 & 00i00 & 00z00 \\
op0j0 & s000r & 0000t & 000i0 & 000z0 \\
0op0j & rs000 & t0000 & 0000i & 0000z
\end{array} \right\}$$

ENCODING METHOD AND ENCODING APPARATUS

BACKGROUND OF THE INVENTION

The present invention relates to an encoding apparatus and an encoding method, and more particularly to an encoding apparatus and an encoding method which are capable of encoding supplied data into high-performance codes with a simple arrangement.

Linear codes for realizing an error correcting code technology using an algebraic process include, for example, quasi-cyclic codes and IRA (Irregular Repeat Accumulate) codes. A quasi-cyclic code having a code length n is a code whose parity-check matrix is expressed as a matrix having m×m cyclic square matrixes as elements where m represents a divisor of n.

FIG. 1 of the accompanying drawings shows an arrangement of a parity-check matrix $H_{QC}$ for quasi-cyclic codes for n=15 and m=5. In FIG. 1, the parity-check matrix $H_{QC}$ includes a 2 (rows)×3 (columns) matrix having 5×5 cyclic square matrixes as elements.

An encoding apparatus for encoding supplied data into quasi-cyclic codes having such a parity-check matrix can simply be constructed using shift registers. For example, R. L. Townsent, E. J. Weldon, Jr., "Self-Orthogonal Quasi-Cyclic Codes", IEEE Transaction on Information Theory, Vol. IT-13, No. 2, April 1967 discloses quasi-cyclic codes on a finite field $F_q$ having elements represented by a power of a prime number, expressed by a code length n, an information length k, and cyclic square matrixes having a size m, n=n0×m, k=k0×m, l:=(n−k)/m=n0−k0. In the quasi-cyclic codes, n0 and l represent the number of columns and the number of rows, respectively, of a parity-check matrix having m×m cyclic square matrixes as elements. In other words, if m elements are considered as a block, then n0, k0, and l represent a code length, an information length, and a parity number.

An IRA code having a code length n and an information length k is generally a code whose parity-check matrix includes an (n−k) information part where zero elements (e.g., 0) and nonzero elements (e.g., 1) are arranged in an arbitrary pattern and a k parity part where nonzero elements are arranged in a step-like pattern and zero elements are placed as remaining entries. IRA codes are known as high-performance codes in the art, as disclosed in H. Jin, A. Khandekar, R. J. McEliece, "Irregular Repeat-Accumulate Codes", in Proc. 2nd International Symposium on Turbo Codes and Related Topics, Brest, France, PP. 1-8, September 2000.

FIG. 2 of the accompanying drawings shows an arrangement of a parity-check matrix $H_{IRA}$ for IRA codes for n=15, k=5. In FIG. 2, the parity-check matrix $H_{IRA}$ includes an information part 11 as a 10 (rows)×5 (columns) matrix and a parity part 12 as a 10 (rows)×10 (columns) matrix.

The parity-check matrix $H_{IRA}$ can be expressed using a Tanner graph shown in FIG. 3 of the accompanying drawings. In FIG. 3, solid circles represent variable nodes, and squares check nodes. The variable nodes correspond to the columns of the parity-check matrix $H_{IRA}$. The parity-check matrix $H_{IRA}$ includes an information part 21 having (n−k) (5 in FIG. 3) variable nodes and a parity part 22 having k (10 in FIG. 3) variable nodes with degree 2 (the number of edges). The check nodes correspond to the rows of the parity-check matrix $H_{IRA}$. The parity-check matrix $H_{IRA}$ has a check node part 23 having k (10 in FIG. 3) check nodes. The check nodes and the variable nodes are connected to each other by edges which correspond to the nonzero elements of the parity-check matrix $H_{IRA}$.

An encoding apparatus for encoding supplied data into IRA codes having such a parity-check matrix will be described below with reference to FIG. 4 of the accompanying drawings. In FIG. 4, the encoding apparatus includes a puncture circuit 31, a random interleaver 32, and an accumulator 33.

The puncture circuit 31 withdraws input information bits according to predetermined rules, and supplies the withdrawn information bits as data to the random interleaver 32. The random interleaver 32 rearranges the data withdrawn by the puncture circuit 31, and supplies the rearranged data to the accumulator 33.

The accumulator 33 includes an arithmetic unit 41 and a shift register 42 having a plurality of memory elements. The arithmetic unit 41 adds the data from the random interleaver 32 and data supplied from the shift register 42 on a finite field $F_2$, i.e., exclusive-ORs the data from the random interleaver 32 and data supplied from the shift register 42, and supplies the sum to the shift register 42. The shift register 42 stores the value supplied from the arithmetic unit 41, and supplies the stored value, i.e., the sum produced by the arithmetic unit 41 in a preceding cycle, to the arithmetic unit 41 and outputs the stored value to a following stage.

The encoding apparatus shown in FIG. 4 outputs a sequence of encoded bits which is a combination of the input data and the value output from the accumulator 33 as IRA-encoded input data to a communication path.

While high-performance codes are realized using IRA codes, the encoding apparatus for encoding supplied data into IRA codes is highly costly and complex in arrangement because it requires the random interleaver 32 that is expensive.

The encoding apparatus for encoding supplied data into quasi-cyclic codes is of a simple arrangement and can easily be implemented as it includes shift registers. However, since parity-check matrixes for IRA codes are not quasi-cyclic, the encoding apparatus for encoding supplied data into quasi-cyclic codes cannot be used to encode supplied data into high-performance codes such as IRA codes.

SUMMARY OF THE INVENTION

It is an object of the present invention to provide an encoding apparatus and an encoding method which are capable of encoding supplied data into high-performance codes with a simple arrangement.

According to the present invention, there is provided an apparatus for encoding data into linear codes on a ring R, including as many shift registers as the length of information input thereto, the shift registers having a plurality of memory elements, a shift adding unit for adding values which are cyclically input depending on a check matrix for the linear codes, from the shift registers, a storage unit for storing parity values of the linear codes, and an accumulative adding unit for adding a sum from the shift adding unit and the parity values of the linear codes stored in the storage unit to each other to determine new parity values of the linear codes, and supplying the new parity values to the storage unit.

In the apparatus, the check matrix for the linear codes may be of a low density.

In the apparatus, the ring R may include a finite field having elements represented by a power of a prime number.

The apparatus may further include a selecting unit for selecting the sum from the shift adding unit depending on the check matrix for the linear codes, and the accumulative adding unit may add the sum selected by the selecting unit and the parity values of the linear codes stored in the storage unit to each other to determine the new parity values of the linear codes, and supply the new parity values to the storage unit.

According to the present invention, there is also provided a method of encoding data into linear codes on a ring R, including the steps of adding values which are cyclically input depending on a check matrix for the linear codes from as many shift registers as the length of information input thereto, the shift registers having a plurality of memory elements, storing parity values of the linear codes in a storage unit, and accumulatively adding a sum from the adding step and the parity values of the linear codes stored in the storage unit to each other to determine new parity values of the linear codes, and supplying the new parity values to the storage unit.

In the method, the check matrix for the linear codes may be of a low density.

In the method, the ring R may include a finite field having elements represented by a power of a prime number.

The method may further include the step of selecting the sum from the adding step depending on the check matrix for the linear codes, and the accumulatively adding step may add the sum selected by the selecting step and the parity values of the linear codes stored in the storage unit to each other to determine the new parity values of the linear codes, and supply the new parity values to the storage unit.

According to the present invention, the values which are cyclically input depending on the check matrix for the linear codes from as many shift registers as the length of information input thereto, the shift registers having a plurality of memory elements, are added to each other, and the sum is added to the parity values of the linear codes stored in the storage unit, determining new parity values of the linear codes. The determined new parity values are supplied to the storage unit.

The encoding apparatus may be an independent apparatus, or may be an encoding block in a recording and reproducing apparatus or a communication apparatus.

The encoding apparatus and the encoding method according to the present invention are capable of encoding supplied data into high-performance codes with a simple arrangement.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1 is a diagram showing a parity-check matrix for quasi-cyclic codes;

FIG. 2 is a diagram showing a parity-check matrix for IRA codes;

FIG. 5 is a diagram showing a parity-check matrix for IRA-type quasi-cyclic codes;

FIG. 7 is a flowchart of an encoding process performed by the encoding apparatus shown in FIG. 6;

FIG. 8 is a diagram showing another parity-check matrix for IRA-type quasi-cyclic codes;

FIG. 11 is a diagram showing still another parity-check matrix for IRA-type quasi-cyclic codes;

DETAILED DESCRIPTION OF THE PREFERRED EMBODIMENTS

Figure 3:
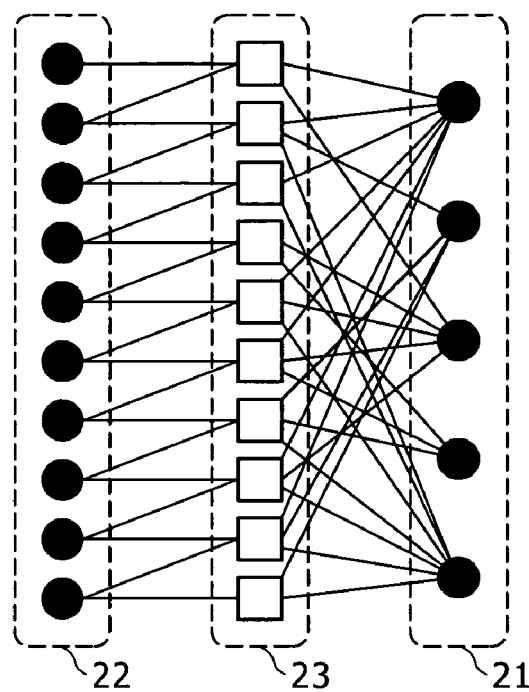
FIG. 3 is a diagram showing a Tanner graph of a parity-check matrix for IRA codes.
Figure 4:
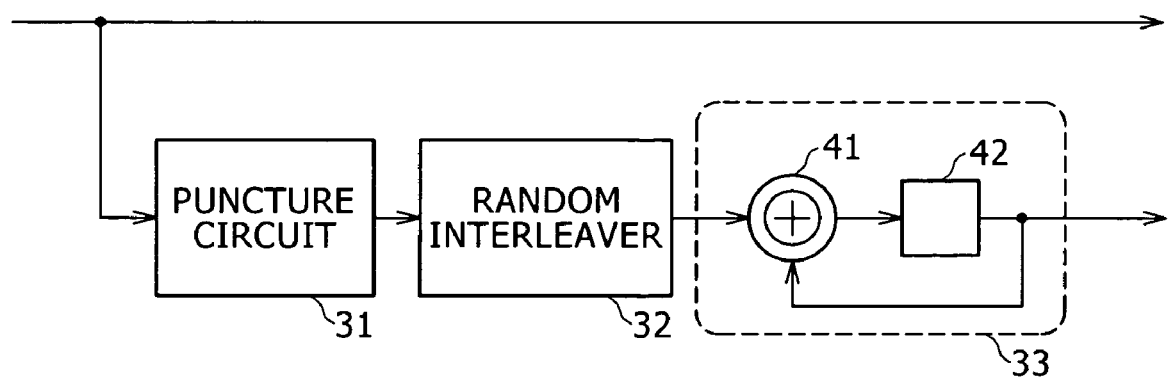
FIG. 4 is a block diagram of an encoding apparatus for encoding data into IRA codes.

Components called for in the present invention and specific components described in embodiments below are related to each other as described below. The description of the relation between those components in the present invention and specific components serves to confirm that the specific components that support the invention described in the present invention are described in the embodiments. Just because there are specific components described in the embodiments, but not described to refer to the components in the present invention does not necessarily mean that those specific components do not correspond to the components in the present invention. Conversely, just because there are specific components described to refer to the components in the present invention does not necessarily mean that those specific components do not correspond to other components than the components in the present invention.

The description of the relation between those components in the present invention and specific components does not serve to confirm that all of the specific components described in the embodiments are called for in the present invention. Stated otherwise, the description of the relation between those components in the present invention and specific components does not deny the existence of inventions covering specific components that are described in the embodiments, but not called for in the present invention, i.e., the existence of inventions which may be filed in divisional applications and/or added by way of amendments in the future.

An apparatus for encoding data into linear codes on a ring R, as defined in the present invention, includes as many shift registers (e.g., shift registers 134-1 through 134-15 in FIG. 6) as the length (e.g., k) of information input thereto, the shift registers having a plurality of memory elements, a shift adding unit (e.g., an adder 135-1 or 135-2 in FIG. 6) for adding values which are cyclically input depending on a check matrix (e.g., a parity-check matrix $H_{QCIRA1}$ in FIG. 5) for the linear codes, from the shift registers, a storage unit (e.g., a register 142 in FIG. 6) for storing parity values of the linear codes, and an accumulative adding unit (e.g., an arithmetic unit 141 in FIG. 6) for adding a sum from the shift adding unit and the parity values of the linear codes stored in the storage unit to each other to determine new parity values of the linear codes, and supplying the new parity values to the storage unit.

An apparatus, as defined in the present invention, further includes a selecting unit (e.g., a switch 136 in FIG. 6) for selecting the sum from the shift adding unit depending on the check matrix for the linear codes, wherein the accumulative adding unit adds the sum selected by the selecting unit and the parity values of the linear codes stored in the storage unit to each other to determine the new parity values of the linear codes, and supplies the new parity values to the storage unit.

A method of encoding data into linear codes on a ring R, as defined in the present invention, includes the steps of adding values which are cyclically input depending on a check matrix (e.g., a parity-check matrix $H_{QCIRA1}$ in FIG. 5) for the linear codes from as many shift registers (e.g., shift registers 134-1 through 134-15 in FIG. 6) as the length (e.g., k) of information input thereto (e.g., step S12 shown in FIG. 7 executed by an adder 135-1 or 135-2 in FIG. 6), the shift registers having a plurality of memory elements, storing parity values of the linear codes in a storage unit (e.g., a register 142 in FIG. 6) (e.g., step S15 shown in FIG. 7), and accumulatively adding a sum from the adding step and the parity values of the linear codes stored in the storage unit to each other to determine new parity values of the linear codes, and supplying the new parity values to the storage unit (e.g., step S14 in FIG. 7).

A method, as defined in the present invention, further includes the step of selecting the sum from the adding step depending on the check matrix for the linear codes (e.g., step S12 shown in FIG. 7 executed by a switch 136 in FIG. 6), wherein the accumulatively adding step adds the sum selected by the selecting step and the parity values of the linear codes stored in the storage unit to each other to determine the new parity values of the linear codes, and supplies the new parity values to the storage unit.

Preferred embodiments of the present invention will be described below with reference to the drawings.

FIG. 5 shows a parity-check matrix $H_{QCIRA1}$ for IRA-type quasi-cyclic codes according to the present invention. IRA-type quasi-cyclic codes are linear codes having a parity-check matrix having properties of both a parity-check matrix for quasi-cyclic codes and a parity-check matrix for IRA codes. In FIG. 5, the parity-check matrix $H_{QCIRA1}$ on a finite field $F_2$ having elements presented by 2 (a power of a prime number) will be described.

In FIG. 5, the parity-check matrix $H_{QCIRA1}$ is a parity-check matrix for encoding information having an information length k of 15 bits into an IRA-type quasi-cyclic code having a code length n of 25 bits and expressed by a cyclic square matrix having a size m, a code length n=n0×m, an information length k=k0×m, l:=(code length n−information length k)/m=n0−k0 (in FIG. 5, n=25, k=15, m=5, n0=5, k0=3, l=2). In the IRA-type quasi-cyclic codes, n0 and l represent the number of columns and the number of rows, respectively, of a parity-check matrix having m×m cyclic square matrixes as elements, as with the conventional quasi-cyclic codes. In other words, if m elements are considered as a block, then n0, k0, and l represent a code length, an information length, and a parity number.

The parity-check matrix $H_{QCIRA1}$ has 10 (rows)×25 (columns) elements. The parity-check matrix $H_{QCIRA1}$ includes an information part 101 having elements represented by the information length k (15) and a parity part 102 having elements represented by code length n−information length k (10). For decoding an IRA-type quasi-cyclic code, the information part 101 is multiplied by the information bits of the IRA-type quasi-cyclic code, and the parity part 102 is multiplied by the parity bits of the IRA-type quasi-cyclic code.

The information part 101 includes a 2 (rows)×3 (columns) quasi-cyclic matrix having, as elements, a matrix $HI_{11}$, a matrix $HI_{12}$, a matrix $HI_{13}$, a matrix $HI_{21}$, a matrix $HI_{22}$, and a matrix $HI_{23}$ (matrixes $HI_{xy}$ ($1 \leq x < 2$), ($1 \leq y \leq 3$), each being a cyclic square matrix having 5 (rows)×5 (columns) elements. Therefore, the information part 101 includes a 1 (rows)×k0 (columns) quasi-cyclic matrix.

The matrix $HI_{11}$ of the information part 101 is a 5×5 cyclic square matrix made up of a first row of "11000", a second row of "01100", a third row of "00110", a fourth row of "00011", and a fifth row of "10001". The matrix $HI_{12}$ of the information part 101 is a 5×5 cyclic square matrix made up of a first row of "10100", a second row of "01010", a third row of "00101", a fourth row of "10010", and a fifth row of "01001". The matrix $HI_{13}$ of the information part 101 is a 5×5 cyclic square matrix made up of a first row of "11100", a second row of "01110", a third row of "00111", a fourth row of "10011", and a fifth row of "11001".

The matrix $HI_{21}$ of the information part 101 is a 5×5 cyclic square matrix made up of a first row of "10110", a second row of "01011", a third row of "10101", a fourth row of "11010", and a fifth row of "01101". The matrix $HI_{22}$ of the information part 101 is a 5×5 cyclic square matrix made up of a first row of "01100", a second row of "00110", a third row of "00011", a fourth row of "10001", and a fifth row of "11000". The matrix $HI_{23}$ of the information part 101 is a 5×5 cyclic square matrix made up of a first row of "01000", a second row of "00100", a third row of "00010", a fourth row of "00001", and a fifth row of "10000".

Therefore, each of the horizontal arrays of the rows of the matrixes $HI_{1y}$ ($1 \leq y \leq 3$) in the first row (hereinafter also referred to as "upper block") of the information part 101 of the parity-check matrix $H_{QCIRA1}$ as a quasi-cyclic matrix is made up of seven 1s and eight 0s, and each row of each of the matrixes $HI_{1y}$ is produced by shifting, to the right, the values of the immediately above row by one position. Each of the horizontal arrays of the rows of the matrixes $HI_{2y}$ ($1 \leq y \leq 3$) in the second row (hereinafter also referred to as "lower block") of the information part 101 of the parity-check matrix $H_{QCIRA1}$ as a quasi-cyclic matrix is made up of six 1s and nine 0s, and each row of each of the matrixes $HI_{2y}$ is produced by shifting, to the right, the values of the immediately above row by one position. Stated otherwise, the values of each row of each of the matrixes $HI_{xy}$ of the information part 101 are produced by cyclically shifting the values of the immediately above row.

The parity part 102 includes a matrix HP which is a 10 (rows)×10 (columns) square matrix having nonzero elements ("1" in FIG. 5) arranged in a step-like pattern and zero elements ("0") placed as remaining entries. The matrix HP of the parity part 102 includes a 10×10 square matrix having a first row of "1000000000", a second row of "1100000000", a third row of "0110000000", a fourth row of "0011000000", a fifth row of "0001100000", a sixth row of "0000110000", a seventh row of "0000011000", an eighth row of "0000001100", a ninth row of "0000000110", and a tenth row of "0000000011". In the matrix HP, each row is produced by shifting, to the right, two 1s of the immediately above row by one position, and has a step-like structure, except that the first row has only one 1.

As described above, the parity-check matrix $H_{QCIRA1}$ for IRA-type quasi-cyclic codes has the information part 101 made up of zero elements and nonzero elements arranged in an arbitrary pattern and the parity part 102 having nonzero elements arranged in a step-like pattern and zero elements placed as remaining entries, as with a parity-check matrix for IRA codes. The information part 101 of the parity-check matrix $H_{QCIRA1}$ has cyclic matrixes as elements, as with a parity-check matrix for quasi-cyclic codes.

An encoding apparatus for encoding data into an IRA-type quasi-cyclic code operates by calculating a generator matrix G which satisfies the equation $GH^T=0$ where $H^T$ represents the transposed matrix $H^T$ of a parity-check matrix H and multiplying the generator matrix G by information words to generate code words c, thereby encoding data into an IRA-type quasi-cyclic code. Therefore, the encoding apparatus can encode information into an IRA-type quasi-cyclic code by determining code words c which satisfy the equation $Hc^T=0$ (the superscripted T represents a transposition) where H represents a parity-check matrix.

Consequently, the encoding apparatus may generate code words c such that the sum on $F_2$ of code words c corresponding to the positions of "0s" in the rows of the parity-check matrix H. Specifically, the first row of the parity-check matrix $H_{QCIRA1}$ shown in FIG. 5 has seven 1s in the information part 101 and one 1 in the first column (the 16th column counted from the first column of the information part 101) of the parity part 102. Therefore, the encoding apparatus calculates the sum on $F_2$ of (exclusive-ORs) the values of code words c corresponding to the positions of 1s in the first row of the information part 101, i.e., the sum of all information bits (seven information bits) which correspond to the positions of 1s in the information part 101, of the values of information of 15 bits (information bits) of the code words c, and sets the calculated sum as a 16th-bit parity value of the code words c, so that the sum on $F_2$ of the values of code words c corresponding to the positions of 1s in the first row becomes 0.

For example, if the sum on $F_2$ of seven information bits which correspond to the positions of 1s in the first row of the information part 101 is "1", then the encoding apparatus sets the 16th-bit parity value of the code words c to "1". Since the sum on $F_2$ of seven information bits which correspond to the positions of 1s in the first row of the information part 101 is "1" and the 16th-bit parity value of the code words c is "1", the sum on $F_2$ of values of the code words c which correspond to the positions of 1s in the first row of the parity-check matrix $H_{QCIRA1}$ is 0.

The second row of the parity-check matrix $H_{QCIRA1}$ has seven 1s in the information part 101 and two is in the first and second columns (the 16th and 17th columns counted from the first column of the information part 101) of the parity part 102. Therefore, the encoding apparatus calculates the sum on $F_2$ of seven information bits which correspond to the positions of 1s in the second row of the information part 101 and the 16th-bit parity value of the code words c which has already been determined by the calculation of the first row, and sets the calculated sum as a 17th-bit parity value of the code words c, so that the sum on $F_2$ of the values of code words c corresponding to the positions of 1s in the second row becomes 0.

For example, if the sum on $F_2$ of seven information bits which correspond to the positions of 1s in the second row of the information part 101 is "0" and the 16th-bit parity value of the code words c is "1", then the encoding apparatus sets the 17th-bit parity value of the code words c to "1". Since the sum on $F_2$ of seven information bits which correspond to the positions of 1s in the first row of the information part 101 is "0", the 16th-bit parity value of the code words c is "1", and the 17th-bit parity value of the code words c is "1", the sum on $F_2$ of values of the code words c which correspond to the positions of 1s in the second row of the parity-check matrix $H_{QCIRA1}$ is 0.

For each of the third through fifth rows of the parity-check matrix $H_{QCIRA1}$, the encoding apparatus also calculates the sum on $F_2$ of seven information bits which correspond to the positions of 1s in the row of the parity-check matrix $H_{QCIRA1}$ and the parity bit determined in the immediately above cycle, thereby determining one parity (bit) value at a time. For each of the sixth through tenth rows of the parity-check matrix $H_{QCIRA1}$, the encoding apparatus calculates the sum on $F_2$ of six information bits which correspond to the positions of 1s in the row of the parity-check matrix $H_{QCIRA1}$ and the parity bit determined in the immediately above cycle, thereby determining one parity (bit) value at a time. In this manner, the encoding apparatus finally determines 10 parity bits. The encoding apparatus combines the 15 information bits and the 10 parity bits into 25-bit code words c, thus encoding information into an IRA-type quasi-cyclic code using the parity-check matrix $H_{QCIRA1}$.

In the parity-check matrix $H_{QCIRA1}$, the positions of 1s in each row of the information part 101 are not random, unlike the conventional parity-check matrix for IRA codes described above with reference to FIG. 2, but are produced by shifting, to the right, the values of the immediately above row by one position in each of the matrixes $HI_{xy}$. That is, the information corresponding to the positions of 1s in each row of the information part 101 can easily be determined using shift registers, as with the encoding apparatus for encoding data into a quasi-cyclic code.

As described above, the encoding apparatus determines the sum on $F_2$ of information corresponding to nonzero elements in the information part of a parity-check matrix, using shift registers, and calculates the sum on $F_2$ (exclusive-ORs) of the sum on $F_2$ of the information and the parity value determined in the immediately previous cycle to determine a new parity value.

Figure 6:
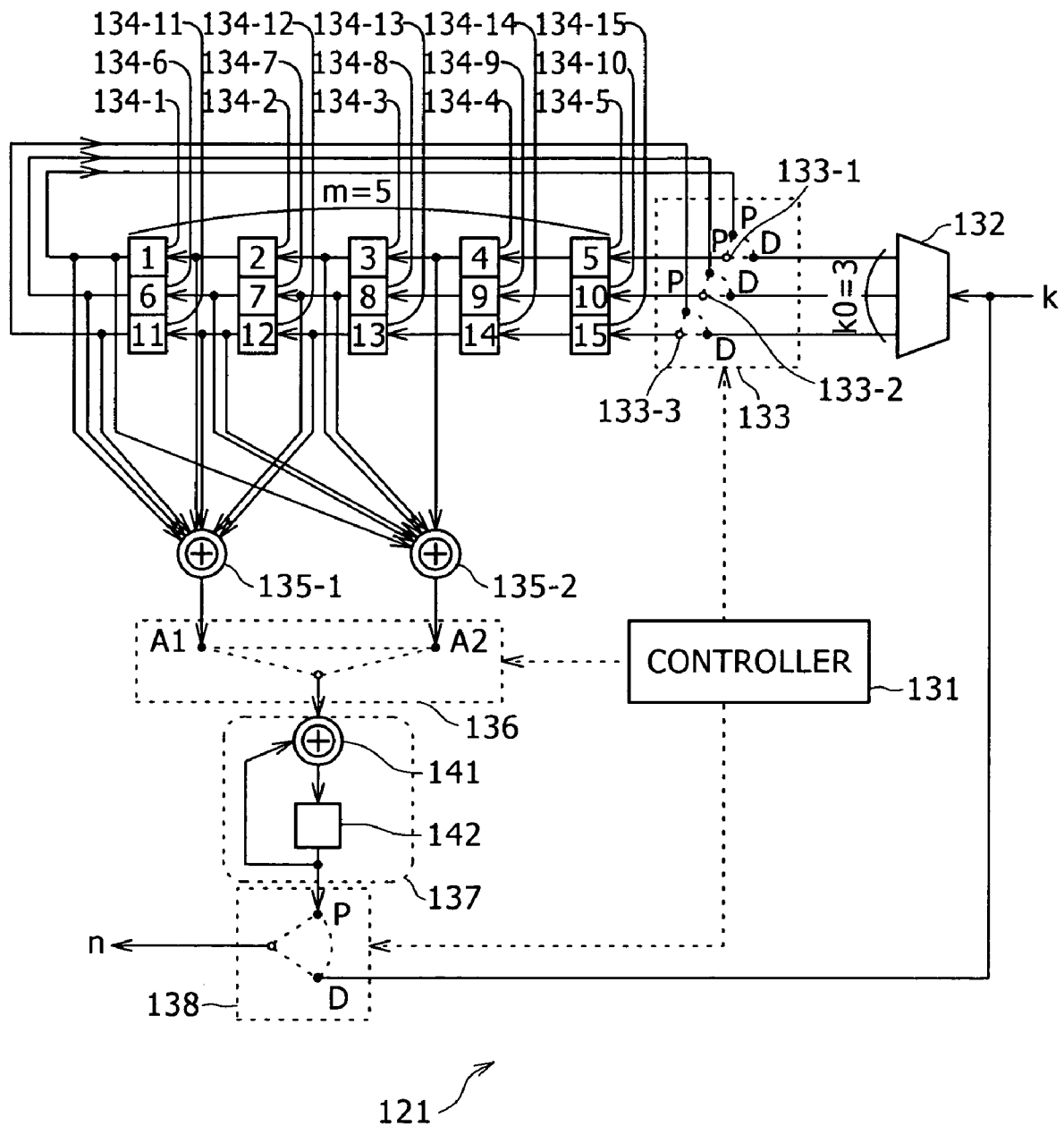
FIG. 6 is a block diagram of an encoding apparatus for encoding data into IRA-type quasi-cyclic codes according to the present invention.

FIG. 6 shows an arrangement of an encoding apparatus 121 according to the present invention. The encoding apparatus 121 encodes input data (information bits) into an IRA-type quasi-cyclic code according to the parity-check matrix $H_{QCIRA1}$ shown in FIG. 5, and outputs the encoded data as code bits. It is assumed that information bits corresponding to ith rows ($1 \leq i \leq 15$) of the matrixes $HI_{xy}$ in the information part 101 of the parity-check matrix $H_{QCIRA1}$ are represented by $m_i$, and code bits output from the encoding apparatus 121 are represented by $c_i$ ($1 \leq i \leq 25$). The encoding apparatus 121 is supplied with information bits $m_1, m_2, m_3, \ldots, m_{15}$ at respective times t1 through t15.

In FIG. 6, a controller 131 performs a timing process based on a clock incorporated therein, and sets (changes) switches 133, 136, and 138 to terminals according to the parity-check matrix $H_{QCIRA1}$. Specifically, at the times t1 through t15, the controller 131 sets the switch 133 to terminals D, storing the supplied information bits $m_1, m_2, m_3, \ldots, m_{15}$ in registers 134-1 through 134-15, and also sets the switch 138 to a terminal D to output the supplied information bits $m_1, m_2, m_3, \ldots, m_{15}$ directly as code bits $c_1=m_1, c_2=m_2, c_3=m_3, \ldots, c_{15}=m_{15}$ to a subsequent stage.

At times t16 through t25, the controller 131 sets the switches 133 to terminals P, cyclically shifting the information bits $m_i$ stored in the registers 134-1 through 134-15, and sets the switch 138 to a terminal P, outputting parity bits calculated in the encoding apparatus 121 as code bits $c_{16}, c_{17}, c_{18}, \ldots, c_{25}$ to the subsequent stage. At the times t16 through t20, the controller 131 sets the switch 136 to a terminal A1, supplying a calculated result from an adder 135-1 to an arithmetic unit 141. At the times t21 through t25, the controller 131 sets the switch 136 to a terminal A2, supplying a calculated result from an adder 135-2 to the arithmetic unit 141.

A separator 132 separates the serially input information bits $m_i$ into k0 parallel sequences (three parallel sequences) of information bits so that information bits $m_i$ will be stored in the corresponding registers 134-1 through 134-15, and supplies the separated information bits $m_i$ to the switch 133. Specifically, the separator 132 separates the information bits $m_i$ into the three parallel sequences so that the information bits $m_1, m_2, m_3, m_4, m_5$ will be stored in the respective registers 134-1 through 134-5, the information bits $m_6, m_7, m_8, m_9, m_{10}$ will be stored in the respective registers 134-6 through 134-10, and the information bits $m_{11}$, $m_{12}$, $m_{13}$, $m_{14}$, $m_{15}$ will be stored in the respective registers 134-11 through 134-15.

The switch 133 includes a switch 133-1 connected to the registers 134-1 through 134-5, a switch 133-2 connected to the registers 134-6 through 134-10, and a switch 133-3 connected to the registers 134-11 through 134-15. Each of the switches 133-1 through 133-3 have terminals P, D and is set to the terminal P or D at a time by the controller 131. When the switches 133-1 through 133-3 are set to the terminal D by the controller 131, they store the information bits $m_i$ from the separator 132 into the registers 134-1 through 134-15. When the switches 133-1 through 133-3 are set to the terminal P by the controller 131, they cyclically shift the information bits $m_i$ stored in the registers 134-1 through 134-15 through three loops.

Specifically, when the switch 133-1 is set to the terminal D by the controller 131, it stores the information bits $m_1$, $m_2$, $m_3$, $m_4$, $m_5$ from the separator 132 in the respective registers 134-1 through 134-5, and when the switch 133-1 is set to the terminal P by the controller 131, it cyclically shifts the information bits stored in the registers 134-1 through 134-5 through a loop having the registers 134-1 through 134-5. When the switch 133-2 is set to the terminal D by the controller 131, it stores the information bits $m_6$, $m_7$, $m_8$, $m_9$, $m_{10}$ from the separator 132 in the respective registers 134-6 through 134-10, and when the switch 133-2 is set to the terminal P by the controller 131, it cyclically shifts the information bits stored in the registers 134-6 through 134-10 through a loop having the registers 134-6 through 134-10. When the switch 133-3 is set to the terminal D by the controller 131, it stores the information bits $m_{11}$, $m_{12}$, $m_{13}$, $m_{14}$, $m_{15}$ from the separator 132 in the respective registers 134-11 through 134-15, and when the switch 133-3 is set to the terminal P by the controller 131, it cyclically shifts the information bits stored in the registers 134-11 through 134-15 through a loop having the registers 134-11 through 134-15.

The registers 134-1 through 134-15 include as many shift registers as the number of input information bits, and store the information bits $m_i$ input thereto. The registers 134-1 through 134-15 are divided into groups to provide k0 (i.e., three) loops, i.e., groups each having m (i.e., five) registers, i.e., groups having registers 134-1 through 134-5, registers 134-6 through 134-10, and registers 134-11 through 134-15, respectively.

The adders 135-1, 135-2 (also referred to as adders 135 if they do not need to be individually separated) are supplied with values depending on the nonzero elements in the rows of the information part 101 of the parity-check matrix $H_{QCIRA1}$. Specifically, the adder 135-1 is supplied with the seven values from the registers 134-1, 134-2, 134-6, 134-8, 134-11, 134-12, 134-13 as the values depending on the nonzero elements in the rows of the upper block ($HI_{1,y}(1 \leq y \leq 3)$) of the information part 101 of the parity-check matrix $H_{QCIRA1}$, and the adder 135-2 is supplied with the six values from the registers 134-1, 134-3, 134-4, 134-7, 134-8, 134-12 as the values depending on the nonzero elements in the rows of the lower block ($HI_{2,y}(1 \leq y \leq 3)$) of the information part 101 of the parity-check matrix $H_{QCIRA1}$, When supplied with the values depending on the nonzero elements in the rows, the adders 135-1, 135-2 calculates the sum on $F_2$ of the supplied values. The encoding apparatus 121 has $l=n0-k0$ (2 in FIG. 6) adders 135. That is, there are as many adders 135 as the number of rows of the information part 101 of the parity-check matrix $H_{QCIRA1}$ which has matrixes as elements.

The switch 136 has the terminal A1 connected to the adder 135-1 and the terminal A2 connected to the adder 135-2. The switch 136 is controlled by the controller 131 to supply the accumulator 137 with the sum on $F_2$ of the values depending on the nonzero elements in the rows of the information part 101 as the calculated sum from the adder 135 that is connected to the selected terminal of the switch 136. The switch 136 has as many terminals as the number of adders 135 ($l=n0-k0$).

The accumulator 137 includes an arithmetic unit 141 and a register 142. The arithmetic unit 141 calculates the sum on $F_2$ of the calculated sum from the switch 136 and the parity bit determined in the immediately previous cycle and stored in the register 142 to determine parity bits of IRA-type quasi-cycle codes, and supplies the determined parity bits to the register 142. The register 142 includes a shift register, for example, and stores the parity bits from the arithmetic unit 141, supplies the stored parity bits to the arithmetic unit 141, and also outputs the stored parity bits as code bits $c_{16}$, $C_{17}$, $c_{18}, \ldots, c_{25}$ through the switch 138 with the terminal P selected to the subsequent stage.

When the switch 138 is set to the terminal P by the controller 131, the switch 138 outputs the input information bits $m_i$ as code bits $c_i$ to the subsequent stage. When the switch 138 is set to the terminal D by the controller 131, the switch 138 outputs the parity bits from the accumulator 137 directly as code bits $c_i$ to the subsequent stage.

An encoding process performed by the encoding apparatus 121 will be described in detail below with reference to FIG. 7. It is assumed that that information bits corresponding to ith rows ($1 \leq i \leq 15$) of the matrixes $HI_{xy}$ in the information part 101 of the parity-check matrix $H_{QCIRA1}$ are represented by $m_i$ and code bits output from the encoding apparatus 121 are represented by $c_i$ ($1 \leq i \leq 25$). The separator 132 is supplied with information bits $m_1, m_2, m_3, \ldots, m_{15}$ at respective times t1 through t15.

In step S11, the controller 131 sets the switch 133 to the terminals D, storing the supplied information bits $m_1$, $m_2$, $m_3, \ldots, m_{15}$ in the registers 134-1 through 134-15, and also sets the switch 138 to the terminal D to output the supplied information bits $m_1$, $m_2$, $m_3, \ldots, m_{15}$ as code bits $c_1=m_1$, $c_2=m_2$, $c_3=m_3, \ldots, c_{15}=m_{15}$ to the subsequent stage. Then, control goes to step S12.

Specifically, at the times t1 through t15, when the switch 133-1 is set to the terminal D, the information bits $m_1$, $m_2$, $m_3$, $m_4$, $m_5$ from the separator 132 are stored successively in the respective registers 134-1 through 134-5, and when the switch 133-2 is set to the terminal D, the information bits $m_6$, $m_7$, $m_8$, $m_9$, $m_{10}$ from the separator 132 are stored successively in the respective registers 134-6 through 134-10, and when the switch 133-3 is set to the terminal D, the information bits $m_{11}$, $m_{12}$, $m_{13}$, $m_{14}$, $m_{15}$ from the separator 132 are stored successively in the respective registers 134-11 through 134-15. Then, the switch 138 is set to the terminal P by the controller 131, outputting the supplied information bits $m_1$, $m_2$, $m_3, \ldots, m_{15}$ directly as code bits $c_1=m_1$, $c_2=m_2$, $c_3=m_3, \ldots, c_{15}=m_{15}$ to the subsequent stage.

If the controller 131 judges that the time t16 is reached based on the clock incorporated therein, then the controller 131 sets the switches 133, 138 to the terminals P and sets the switch 136 depending on the parity-check matrix $H_{QCIRA1}$ in step S12, after which control goes to step S13. In step S12, the adders 135 are supplied with values depending on the parity-check matrix $H_{QCIRA1}$, and calculate the sum on $F_2$ of the supplied values, i.e., exclusive-OR the supplied values, and supply the calculated sum to the arithmetic unit 141.

The processing of step S12 will be described in greater detail below. At the time t16, the controller 131 starts cyclically shifting the information bits $m_i$ stored in the registers 134-1 through 134-15. When the switch 133-1 is set to the terminal P, the information bits $m_1$, $m_2$, $m_3$, $m_4$, $m_5$ stored in the registers 134-1 through 134-5 start being cyclically shifted through the loop having the registers 134-1 through 134-5. When the switch 133-2 is set to the terminal P, the information bits $m_6$, $m_7$, $m_8$, $m_9$, $m_{10}$ stored in the registers 134-6 through 134-10 start being cyclically shifted through the loop having the registers 134-6 through 134-10. When the switch 133-2 is set to the terminal P, the information bits $m_{11}$, $m_{12}$, $m_{13}$, $m_{14}$, $m_{15}$ stored in the registers 134-11 through 134-15 start being cyclically shifted through the loop having the registers 134-11 through 134-15.

The adders 135 are supplied with values depending on the parity-check matrix $H_{QCIRA1}$, i.e., values depending on the nonzero elements in the rows of the information part 101 of the parity-check matrix $H_{QCIRA1}$. When the information bits start being cyclically shifted through the loops, the adder 135-1 is supplied with the seven information values (information bits) stored in the registers 134-1, 134-2, 134-6, 134-8, 134-11, 134-12, 134-13, and the adder 135-2 is supplied with the six information values stored in the registers 134-1, 134-3, 134-4, 134-7, 134-8, 134-12.

At the times t16 through t20, the controller 131 sets the switch 136 to the terminal A1 depending on the rows of the information part 101 of the parity-check matrix $H_{QCIRA1}$, supplying the calculated sum from the adder 135-1 to the arithmetic unit 141. At the times t21 through t25, the controller 131 sets the switch 136 to the terminal A2 depending on the rows of the information part 101 of the parity-check matrix $H_{QCIRA1}$, supplying the calculated sum from the adder 135-2 to the arithmetic unit 141.

Accordingly, at the time t16, for example, the values ($m_1$, $m_2$, $m_6$, $m_8$, $m_{11}$, $m_{12}$, $m_{13}$) corresponding to the first row of the information part 101 of the parity-check matrix $H_{QCIRA1}$ are supplied to the adder 135-1, which calculates the sum on $F_2$ of the supplied values corresponding to the first row of the information part 101 of the parity-check matrix $H_{QCIRA1}$. At this time, since the switch 136 is set to the terminal A1, the calculated sum for the first row from the adder 135-1, i.e., the sum on $F_2$ of the values depending on the nonzero elements in the first row of the information part 101 of the parity-check matrix $H_{QCIRA1}$, is supplied through the switch 136 to the arithmetic unit 141.

At the time t17, for example, the values ($m_2$, $m_3$, $m_7$, $m_9$, $m_{12}$, $m_{13}$, $m_{14}$) corresponding to the second row of the information part 101 of the parity-check matrix $H_{QCIRA1}$ are supplied to the adder 135-1, which calculates the sum on $F_2$ of the supplied values corresponding to the second row of the information part 101 of the parity-check matrix $H_{QCIRA1}$. At this time, since the switch 136 is set to the terminal A1, the calculated sum for the second row from the adder 135-1 is supplied through the switch 136 to the arithmetic unit 141.

At each of the times t18 through t20, the same processing as at the times t16, t17 is performed. Specifically, the adder 135-1 calculates the sum on $F_2$ of the supplied values corresponding to the row to be processed of the information part 101 of the parity-check matrix $H_{QCIRA1}$, and supplies the calculated sum to the arithmetic unit 141.

At the time t21, for example, the values ($m_1$, $m_3$, $m_4$, $m_7$, $m_8$, $m_{12}$) corresponding to the sixth row of the information part 101 of the parity-check matrix $H_{QC1RA1}$ are supplied to the adder 135-2, which calculates the sum on $F_2$ of the supplied values corresponding to the sixth row of the information part 101 of the parity-check matrix $H_{QCIRA1}$. At this time, since the switch 136 is set to the terminal A2, the calculated sum for the sixth row from the adder 135-2 is supplied through the switch 136 to the arithmetic unit 141.

At the time t22, for example, the values ($m_2$, $m_4$, $m_5$, $m_8$, $m_9$, $m_{13}$) corresponding to the seventh row of the information part 101 of the parity-check matrix $H_{QCIRA1}$ are supplied to the adder 135-2, which calculates the sum on $F_2$ of the supplied values corresponding to the seventh row of the information part 101 of the parity-check matrix $H_{QCIRA1}$. At this time, since the switch 136 is set to the terminal A2, the calculated sum for the seventh row from the adder 135-2 is supplied through the switch 136 to the arithmetic unit 141.

At each of the times t23 through T25, the same processing as at the times t21, t22 is performed. Specifically, the adder 135-2 calculates the sum on $F_2$ of the supplied values corresponding to the row to be processed of the information part 101 of the parity-check matrix $H_{QCIRA1}$, and supplies the calculated sum to the arithmetic unit 141 through the switch 136.

As described above, at step 12, the adder 135-1 or 135-2 supplies the sum on $F_2$ of the values corresponding to the nonzero elements in the rows of the information part 101 of the parity-check matrix $H_{QCIRA1}$ of the information part 101 to the arithmetic unit 141. Then, control goes from step S12 to step S13.

In step S13, the register 142 supplies the parity bits stored in step S15, to be described later on, to the arithmetic unit 141. Then, control goes to step S14. When the encoding process is started, an initial value of "0" is stored in the register 142. Therefore, when step S13 is executed for the first time, the register 142 supplies "0" to the arithmetic unit 141.

In step S14, the arithmetic unit 141 calculates the sum on $F_2$ of the calculated result for the row to be processed of the information part 101 of the parity-check matrix $H_{QCIRA1}$, which is supplied from the adder 135-1 or 135-2, and the parity bits stored in the register 142, determining new parity bits, and supplies the determined parity bits to the register 142. Then, control goes to step S15. In step S15, the register 142 stores the supplied parity bits. Then, control goes to step S16 in which the register 142 outputs the supplied parity bits through the switch 138 with the terminal P selected as code bits $c_i$ to the subsequent stage. Thereafter, control goes to step S17.

In step S17, the controller 131 determines whether the time t25 is reached based on the clock incorporated therein and all code bits $c_i$ have been output or not. If the controller 131 judges that the time t25 is not reached and all code bits $c_i$ have not been output, then control goes back to step S12, and the processing from step S12 is repeated. If the controller 131 judges in step S17 that the time t25 is reached and all code bits $c_i$ have been output, then the encoding process is put to an end.

The code bits are output in the order of code bits $c_{16}$, $c_{17}$, $c_{18}$, $c_{19}$, $c_{20}$, $c_{21}$, $c_{22}$, $c_{23}$, $c_{24}$, $c_{25}$ to the subsequent stage. The encoding apparatus 121 finally determines 10 parity bits, and combines the 15 information bits and the 10 parity bits, thereby generating a 25-bit IRA-type quasi-cyclic code. The encoding apparatus 121 thus encodes information into an IRA-type quasi-cyclic code, using the parity-check matrix $H_{QCIRA1}$.

Since the information part 101 of the parity-check matrix $H_{QCIRA1}$ is represented by quasi-cyclic matrixes, and the sum of the values corresponding to the nonzero elements in the rows of the information part 101 of the parity-check matrix $H_{QCIRA1}$ is simply determined using shift registers, new parity bits can be determined by calculating the sum on $F_2$ of, i.e., exclusive-ORing, the determined sum of the values corresponding to the nonzero elements in the rows and the parity bits determined in the immediately previous cycle.

The encoding apparatus 121 does not employ an expensive random interleaver, but is of a less costly and simple arrangement as it employs simple shift registers.

FIG. 8 shows another parity-check matrix $H_{QCIRA2}$ for encoding data into IRA-type quasi-cyclic codes according to the present invention. The parity-check matrix $H_{QCIRA2}$ shown in FIG. 8 is another example of the parity-check matrix $H_{QCIRA1}$ shown in FIG. 5, will not be described in detail to avoid a repetitive description. In FIG. 8, the parity-check matrix $H_{QCIRA2}$ on a finite field $F_q$ (q=$p^s$, p: prime number, s: natural number) will be described.

In FIG. 8, the parity-check matrix $H_{QCIRA2}$ is a parity-check matrix for encoding information having an information length k=15 into an IRA-type quasi-cyclic code having a code length n=25 and expressed by a cyclic square matrix having a size m, a code length n=n0×m, an information length k=k0× m, l:=(code length n−information length k)/m=n0−k0 (in FIG. 8, n=25, k=15, m=5, n0=5, k0=3, l=2). In the parity-check matrix $H_{QCIRA2}$, a, b, c, d, e, f, g, h, i, j, o, p, r, s, t ∈ $F_q$, and h represents an invertible element (h·h$^{-1}$=0).

The parity-check matrix $H_{QCIRA2}$ has 10 (rows)×25 (columns) elements. The parity-check matrix $H_{QCIRA2}$ includes an information part 201 having elements represented by the information length k (15) and a parity part 202 having elements represented by code length n−information length k (10). The information part 201 includes a 2 (rows)×3 (columns) quasi-cyclic matrix having, as elements, a matrix $HI_{11}$, a matrix $HI_{12}$, a matrix $HI_{13}$, a matrix $HI_{21}$, a matrix $HI_{22}$, and a matrix $HI_{23}$ (matrixes $HI_{xy}$ (1≦x<2), (1≦y≦3), each being a cyclic square matrix having 5 (rows)×5 (columns) elements.

The matrix $HI_{11}$ of the information part 201 is a 5×5 cyclic square matrix made up of a first row of "ab000", a second row of "0ab00", a third row of "00ab0", a fourth row of "000ab", and a fifth row of "b000a". The matrix $HI_{12}$ of the information part 201 is a 5×5 cyclic square matrix made up of a first row of "c0d00", a second row of "0c0d0", a third row of "00c0d", a fourth row of "d00c0", and a fifth row of "0d00c". The matrix $HI_{13}$ of the information part 201 is a 5×5 cyclic square matrix made up of a first row of "efg00", a second row of "0efg0", a third row of "00efg", a fourth row of "g00ef", and a fifth row of "fg00e".

The matrix $HI_{21}$ of the information part 201 is a 5×5 cyclic square matrix made up of a first row of "j0op0", a second row of "0j0op", a third row of "p0j0o", a fourth row of "op0j0", and a fifth row of "0op0j". The matrix $HI_{22}$ of the information part 201 is a 5×5 cyclic square matrix made up of a first row of "0rs00", a second row of "00rs0", a third row of "000rs", a fourth row of "s000r", and a fifth row of "rs000". The matrix $HI_{23}$ of the information part 201 is a 5×5 cyclic square matrix made up of a first row of "0t000", a second row of "00t00", a third row of "000t0", a fourth row of "0000t", and a fifth row of "t0000".

Therefore, each of the horizontal arrays of the rows in the upper block (matrixes $HI_{1y}$ (1≦y≦3)) of the information part 201 is made up of seven nonzero elements and eight zero elements "0", and each row of each of the matrixes $HI_{1y}$ is produced by shifting, to the right, the values of the immediately above row by one position. Each of the horizontal arrays of the rows in the lower block (matrixes $HI_{2y}$ (1≦y≦3)) of the information part 201 is made up of six nonzero elements and nine zero elements "0", and each row of each of the matrixes $HI_{2y}$ is produced by shifting, to the right, the values of the immediately above row by one position. Stated otherwise, the values of each row of each of the matrixes $HI_{xy}$ of the information part 201 are produced by cyclically shifting the values of the immediately above row.

The parity part 202 includes a matrix HP which is a 10 (rows)×10 (columns) square matrix having nonzero elements ("h" and "i" in FIG. 8) arranged in a step-like pattern and zero elements ("0") placed as remaining entries. The matrix HP of the parity part 202 includes a 10×10 square matrix having a first row of "h000000000", a second row of "ih00000000", a third row of "0ih0000000", a fourth row of "00ih000000", a fifth row of "000ih00000", a sixth row of "0000ih0000", a seventh row of "00000ih000", an eighth row of "000000ih00", a ninth row of "0000000ih0", and a tenth row of "00000000ih". In the matrix HP, each row is produced by shifting, to the right, "h" and "i" of the immediately above row by one position, and has a step-like structure, except that the first row has only one h.

As described above, the parity-check matrix $H_{QCIRA2}$ for IRA-type quasi-cyclic codes has the information part 201 made up of zero elements and nonzero elements arranged in an arbitrary pattern and the parity part 202 having nonzero elements arranged in a step-like pattern and zero elements placed as remaining entries, as with a parity-check matrix for IRA codes. The information part 201 of the parity-check matrix $H_{QCIRA2}$ has cyclic matrixes as elements, as with a parity-check matrix for quasi-cyclic codes.

Figure 9:
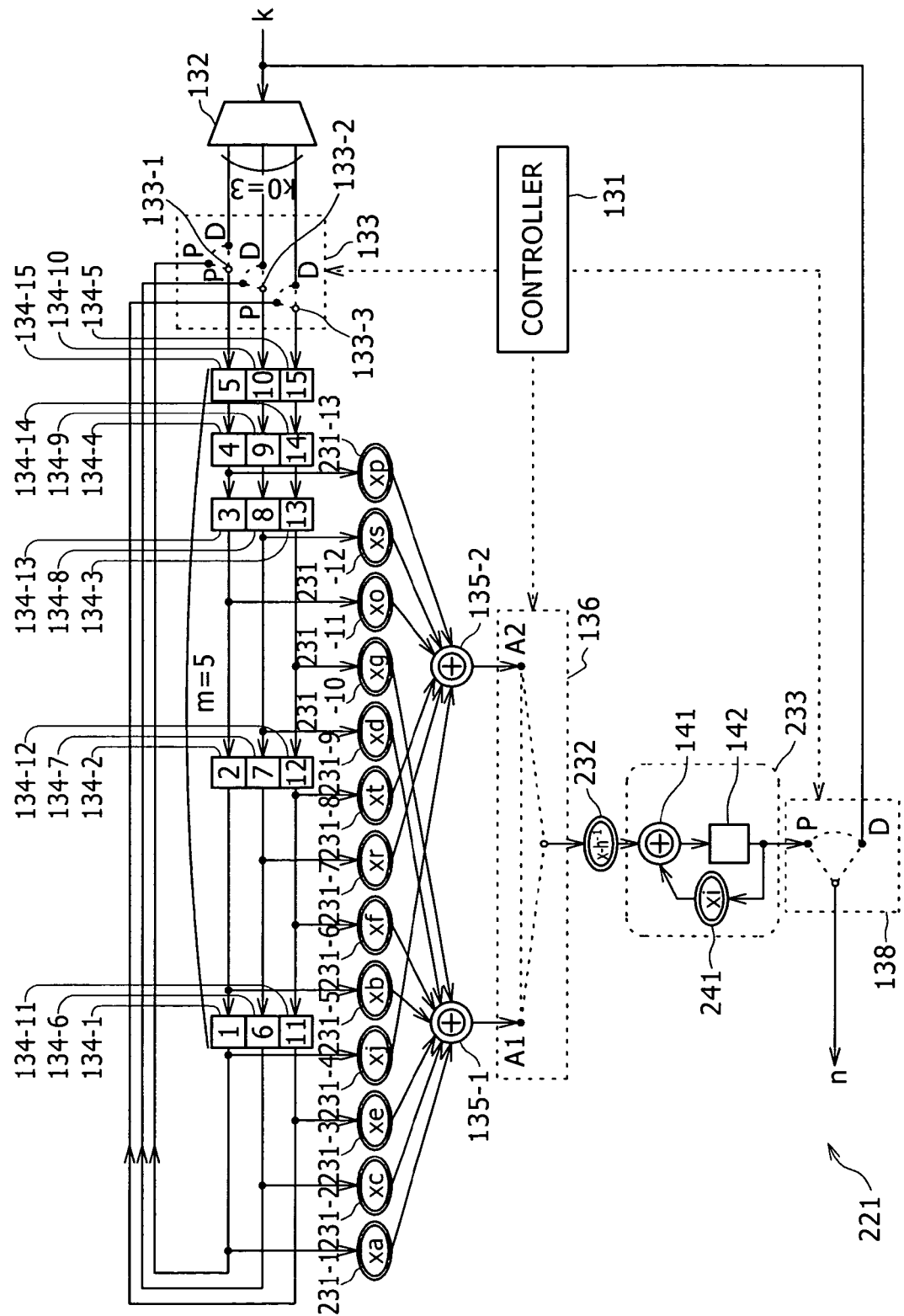
FIG. 9 is a block diagram of another encoding apparatus for encoding data into IRA-type quasi-cyclic codes according to the present invention.

FIG. 9 shows in block form an encoding apparatus 221 for encoding data into IRA-type quasi-cyclic codes according to the present invention. The encoding apparatus 221 shown in FIG. 9 is essentially of the same arrangement as the encoding apparatus 121 shown in FIG. 6 except that multipliers 231-1 through 231-13 and a multiplier 232 are added, and an accumulator 233 is added instead of the accumulator 137. Therefore, the encoding apparatus 221 will not be described in detail below to avoid a repetitive description.

The encoding apparatus 221 shown in FIG. 9 encodes input data (information symbols) into an IRA-type quasi-cyclic code according to the parity-check matrix $H_{QCIRA2}$ shown in FIG. 8, and outputs the encoded data as code symbols. It is assumed that information symbols corresponding to uth rows (1≦u≦15) of the matrixes $HI_{xy}$ in the information part 201 of the parity-check matrix $H_{QCIRA2}$ are represented by $m_u$ and code symbols output from the encoding apparatus 221 are represented by $c_u$ (1≦u≦25). The encoding apparatus 221 is supplied with information symbols $m_1, m_2, m_3, \ldots, m_{15}$ at respective times t1 through t15.

In FIG. 9, a controller 131 performs a timing process based on a clock incorporated therein, and sets (changes) switches 133, 136, and 138 to terminals according to the parity-check matrix $H_{QCIRA2}$. A separator 132 separates the serially input information symbols $m_u$ into three parallel sequences of information symbols so that information symbols $m_u$ will be stored in the corresponding registers 134-1 through 134-15, and supplies the separated information symbols $m_u$ to the switch 133.

When the switches 133-1 through 133-3 are set to the terminals D by the controller 131, they store the information symbols $m_u$ from the separator 132 into the respective registers 134-1 through 134-15, and when the switches 133-1 through 133-3 are set to the terminals P by the controller 131, they cyclically shift the information symbols $m_u$ stored in the registers 134-1 through 134-15 through the three loops. The registers 134-1 through 134-15 include shift registers, and store the information symbols $m_u$ input thereto. The registers 134-1 through 134-15 are divided into groups to provide three loops, i.e., groups having registers 134-1 through 134-5, registers 134-6 through 134-10, and registers 134-11 through 134-15, respectively.

The adders 135-1, 135-2 are connected to the registers 134-1 through 134-15 through the multipliers 231-1 through 231-13 such that the adders 135-1, 135-2 are supplied with the values depending on the nonzero elements in the rows of the information part 201 of the parity-check matrix $H_{QCIRA2}$. The number of the multipliers 231-1 through 231-13 is determined by the number of nonzero elements in the information part 201.

Specifically, the multiplier 231-1 is connected between the register 134-1 and the adder 135-1, and multiplies the information symbol $m_u$ from the register 134-1 by "a". The multiplier 231-2 is connected between the register 134-6 and the adder 135-1, and multiplies the information symbol $m_u$ from the register 134-6 by "c". The multiplier 231-3 is connected between the register 134-11 and the adder 135-1, and multiplies the information symbol $m_u$ from the register 134-11 by "e". The multiplier 231-4 is connected between the register 134-1 and the adder 135-2, and multiplies the information symbol $m_u$ from the register 134-11 by "j". The multiplier 231-5 is connected between the register 134-2 and the adder 135-1, and multiplies the information symbol $m_u$ from the register 134-2 by "b". The multiplier 231-6 is connected between the register 134-12 and the adder 135-1, and multiplies the information symbol $m_u$ from the register 134-12 by "f". The multiplier 231-7 is connected between the register 134-7 and the adder 135-2, and multiplies the information symbol $m_u$ from the register 134-7 by "r".

The multiplier 231-8 is connected between the register 134-12 and the adder 135-2, and multiplies the information symbol $m_u$ from the register 134-12 by "t". The multiplier 231-9 is connected between the register 134-8 and the adder 135-1, and multiplies the information symbol $m_u$ from the register 134-8 by "d". The multiplier 231-10 is connected between the register 134-13 and the adder 135-1, and multiplies the information symbol $m_u$ from the register 134-13 by "g". The multiplier 231-11 is connected between the register 134-3 and the adder 135-2, and multiplies the information symbol $m_u$ from the register 134-3 by "o". The multiplier 231-12 is connected between the register 134-8 and the adder 135-2, and multiplies the information symbol $m_u$ from the register 134-8 by "s". The multiplier 231-13 is connected between the register 134-4 and the adder 135-2, and multiplies the information symbol $m_u$ from the register 134-4 by "p".

Therefore, the adder 135-1 is supplied with, as the values depending on the nonzero elements in the rows of the upper block ($HI_{1y}$ ($1 \leq y \leq 3$)) of the information part 201 of the parity-check matrix $H_{QCIRA2}$, the information symbol $m_u$ from the register 134-1 as multiplied by "a" by the multiplier 231-1, the information symbol $m_u$ from the register 134-2 as multiplied by "b" by the multiplier 231-5, the information symbol $m_u$ from the register 134-6 as multiplied by "c" by the multiplier 231-2, the information symbol $m_u$ from the register 134-8 as multiplied by "d" by the multiplier 231-9, the information symbol $m_u$ from the register 134-11 as multiplied by "e" by the multiplier 231-3, the information symbol $m_u$ from the register 134-12 as multiplied by "f" by the multiplier 231-6, and the information symbol $m_u$ from the register 134-13 as multiplied by "g" by the multiplier 231-10.

The adder 135-2 is supplied with, as the values depending on the nonzero elements in the rows of the lower block ($HI_{2y}$ ($1 \leq y \leq 3$)) of the information part 201 of the parity-check matrix $H_{QCIRA2}$, the information symbol $m_u$ from the register 134-1 as multiplied by "j" by the multiplier 231-4, the information symbol $m_u$ from the register 134-3 as multiplied by "o" by the multiplier 231-11, the information symbol $m_u$ from the register 134-4 as multiplied by "p" by the multiplier 231-13, the information symbol $m_u$ from the register 134-7 as multiplied by "r" by the multiplier 231-7, the information symbol $m_u$ from the register 134-8 as multiplied by "s" by the multiplier 231-12, and the information symbol $m_u$ from the register 134-12 as multiplied by "t" by the multiplier 231-8.

When supplied with the values depending on the nonzero elements in the rows, the adders 135-1, 135-2 calculates the sum on $F_q$ of the supplied values. The switch 136 has the terminal A1 connected to the adder 135-1 and the terminal A2 connected to the adder 135-2. The switch 136 is controlled by the controller 131 to supply the accumulator 233 with the sum on $F_2$ of the values depending on the nonzero elements in the rows as the calculated sum from the adder 135 that is connected to the selected terminal of the switch 136. The multiplier 232 is connected between the switch 136 and the accumulator 233, and multiplies the parity bits from the switch 136 by "$-h^{-1}$" and supplies the product to the accumulator 233.

The accumulator 233 includes an arithmetic unit 141, a register 142, and a multiplier 241. The arithmetic unit 141 calculates the sum on $F_q$ of the product from the multiplier 232 and the parity symbols from the register 142 as multiplied by "i" by the multiplier 241, thereby determining new parity symbols, and supplies the determined parity symbols to the register 142. The register 142 includes a shift register, for example, and stores the parity symbols from the arithmetic unit 141, supplies the stored parity symbols to the arithmetic unit 141 through the multiplier 241, and also outputs the stored parity symbols as code symbols $c_{16}, c_{17}, c_{18}, \ldots, c_{25}$ through the switch 138 with the terminal P selected to the subsequent stage. The multiplier 241 multiplies the parity symbols from the register 142 by "i", and supplies the product to the arithmetic unit 141.

When the switch 138 is set to the terminal D by the controller 131, the switch 138 outputs the input information symbols $m_u$ as code symbols $c_u$ to the subsequent stage. When the switch 138 is set to the terminal P by the controller 131, the switch 138 outputs the parity symbols from the accumulator 233 directly as code symbols $c_u$ to the subsequent stage.

Figure 10:
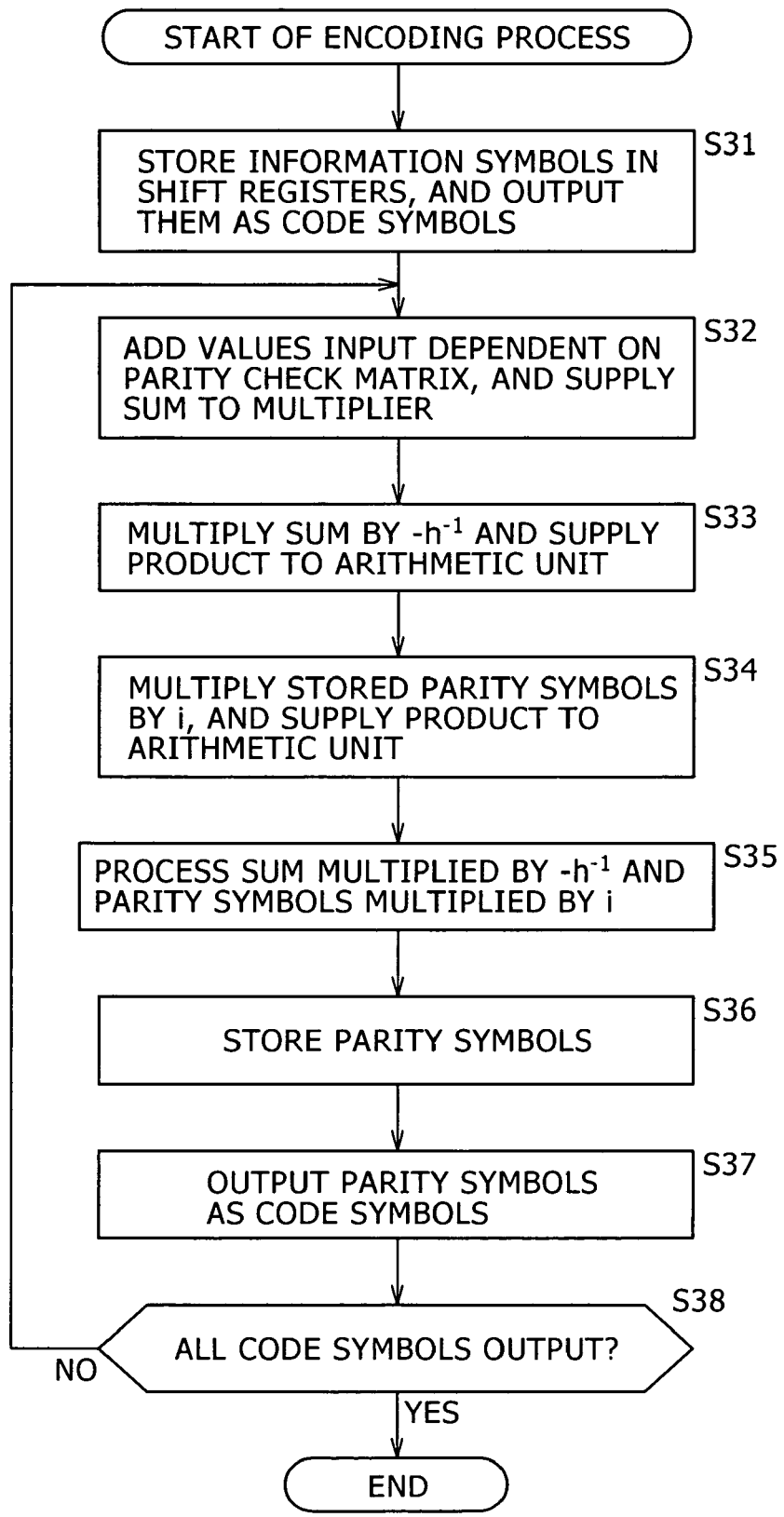
FIG. 10 is a flowchart of an encoding process performed by the encoding apparatus shown in FIG. 9.

An encoding process performed by the encoding apparatus 221 will be described in detail below with reference to FIG. 10. Steps S31 and S35 through S38 shown in FIG. 10 are identical to steps S11 and S14 through S17 shown in FIG. 7, and will not be described in detail below to avoid a repetitive description.

It is assumed that information symbols corresponding to uth rows ($1 \leq u \leq 15$) of the matrixes $HI_{xy}$ in the information part 201 of the parity-check matrix $H_{QCIRA2}$ are represented by $m_u$ and code symbols output from the encoding apparatus 221 are represented by $c_u$ ($1 \leq u \leq 25$). The separator 132 is supplied with information symbols $m_1, m_2, m_3, \ldots, m_{15}$ at respective times t1 through t15.

In step S31, the controller 131 sets the switch 133 to the terminals D, storing the supplied information symbols $m_1, m_2, m_3, \ldots, m_{15}$ in the registers 134-1 through 134-15, and also sets the switch 138 to the terminal D, outputting the supplied information symbols $m_1, m_2, m_3, \ldots, m_{15}$ as code symbols $c_1=m_1, c_2=m_2, c_3=m_3, \ldots, c_{15}=m_{15}$ to the subsequent stage. Then, control goes to step S32.

If the controller 131 judges that the time t16 is reached based on the clock incorporated therein, then the controller 131 sets the switches 133, 138 to the terminals P and sets the switch 136 depending on the parity-check matrix $H_{QCIRA2}$ in step S32, after which control goes to step S33. In step S32, the adders 135 are supplied with values depending on the parity-check matrix $H_{QCIRA2}$, and calculate the sum on $F_2$ of the supplied values, and supply the calculated sum to the multiplier 232.

The processing of step S32 will be described in greater detail below. The controller 131 starts cyclically shifting the information symbols $m_u$ stored in the registers 134-1 through 134-15. When the switch 133-1 is set to the terminal P, the information symbols stored in the registers 134-1 through 134-15 start being cyclically shifted through the three loops, as described above with reference to FIG. 7.

As described above with reference to FIG. 9, the adders 135-1, 135-2 are connected to the registers 134-1 through 134-15 through the multipliers 231-1 through 231-13 such that the adders 135-1, 135-2 are supplied with the values depending on the nonzero elements in the rows of the information part 201 of the parity-check matrix $H_{QCIRA2}$. When the information symbols start being cyclically shifted through the loops, the adder 135-1 is supplied with, as the values depending on the nonzero elements in the rows of the upper block ($HI_{1y}$ ($1 \leq y \leq 3$)) of the information part 201 of the parity-check matrix $H_{QCIRA2}$, the information symbol $m_u$ from the register 134-1 as multiplied by "a" by the multiplier 231-1, the information symbol $m_u$ from the register 134-2 as multiplied by "b" by the multiplier 231-5, the information symbol $m_u$ from the register 134-6 as multiplied by "c" by the multiplier 231-2, the information symbol $m_u$ from the register 134-8 as multiplied by "d" by the multiplier 231-9, the information symbol $m_u$ from the register 134-11 as multiplied by "e" by the multiplier 231-3, the information symbol $m_u$ from the register 134-12 as multiplied by "f" by the multiplier 231-6, and the information symbol $m_u$ from the register 134-13 as multiplied by "g" by the multiplier 231-10.

The adder 135-2 is supplied with, as the values depending on the nonzero elements in the rows of the lower block ($HI_{2y}$ ($1 \leq y \leq 3$)) of the information part 201 of the parity-check matrix $H_{QCIRA2}$, the information symbol $m_u$ from the register 134-1 as multiplied by "j" by the multiplier 231-4, the information symbol $m_u$ from the register 134-3 as multiplied by "o" by the multiplier 231-11, the information symbol $m_u$ from the register 134-4 as multiplied by "p" by the multiplier 231-13, the information symbol $m_u$ from the register 134-7 as multiplied by "r" by the multiplier 231-7, the information symbol $m_u$ from the register 134-8 as multiplied by "s" by the multiplier 231-12, and the information symbol $m_u$ from the register 134-12 as multiplied by "t" by the multiplier 231-8.

Depending on the rows of the information part 201 of the parity-check matrix $H_{QCIRA2}$, the controller 131 sets the switch 136 to the terminal A1 at the times t16 through t20, supplying the calculated sum from the adder 135-1 to the multiplier 232, and sets the switch 136 to the terminal A2 at the times t21 through t25, supplying the calculated sum from the adder 135-2 to the multiplier 232.

At the time t16, for example, the values (a·$m_1$, b·$m_2$, c·$m_6$, d·$m_8$, e·$m_{11}$, f·$m_{12}$, g·$m_{13}$) corresponding to the first row of the information part 201 of the parity-check matrix $H_{QCIRA2}$ are supplied to the adder 135-1, which calculates the sum on $F_q$ of the supplied values corresponding to the first row of the information part 201 of the parity-check matrix $H_{QCIRA2}$. At this time, since the switch 136 is set to the terminal A1, the calculated sum from the adder 135-1, i.e., the sum on $F_2$ of the values depending on the nonzero elements in the first row of the information part 201 of the parity-check matrix $H_{QCIRA2}$, is supplied through the switch 136 to the multiplier 232.

At the time t17, for example, the values (a·$m_2$, b·$m_3$, c·$m_7$, d·$m_9$, e·$m_{12}$, f·$m_{13}$, g·$m_{14}$) corresponding to the second row of the information part 201 of the parity-check matrix $H_{QCIRA2}$ are supplied to the adder 135-1, which calculates the sum on $F_q$ of the supplied values corresponding to the second row of the information part 201 of the parity-check matrix $H_{QCIRA2}$. At this time, since the switch 136 is set to the terminal A1, the calculated sum for the second row from the adder 135-1 is supplied through the switch 136 to the multiplier 232.

At each of the times t18 through t20, the same processing as at the times t16, t17 is performed. Specifically, the adder 135-1 calculates the sum on $F_q$ of the supplied values corresponding to the row to be processed of the information part 201 of the parity-check matrix $H_{QCIRA2}$, and supplies the calculated sum through the switch 136 to the multiplier 232.

At the time t21, for example, the values (j·$m_1$, o·$m_3$, p·$m_4$, r·$m_7$, s·$m_8$, t·$m_{12}$) corresponding to the sixth row of the information part 201 of the parity-check matrix $H_{QCIRA2}$ are supplied to the adder 135-2, which calculates the sum on $F_q$ of the supplied values corresponding to the sixth row of the information part 201 of the parity-check matrix $H_{QCIRA2}$. At this time, since the switch 136 is set to the terminal A2, the calculated sum for the sixth row from the adder 135-2 is supplied through the switch 136 to the multiplier 232.

At the time t22, for example, the values (j·$m_2$, o·$m_4$, p·$m_5$, r·$m_8$, s·$m_9$, t·$m_{13}$) corresponding to the seventh row of the information part 201 of the parity-check matrix $H_{QCIRA2}$ are supplied to the adder 135-2, which calculates the sum on $F_q$ of the supplied values corresponding to the seventh row of the information part 201 of the parity-check matrix $H_{QCIRA2}$. At this time, since the switch 136 is set to the terminal A2, the calculated sum for the seventh row from the adder 135-2 is supplied through the switch 136 to the multiplier 232.

At each of the times t23 through t25, the same processing as at the times t21, t22 is performed. Specifically, the adder 135-2 calculates the sum on $F_q$ of the supplied values corresponding to the row to be processed of the information part 201 of the parity-check matrix $H_{QCIRA2}$, and supplies the calculated sum through the switch 136 to the multiplier 232.

As described above, in step S32, the sum of the values corresponding to the row to be processed of the information part 201 of the parity-check matrix $H_{QCIRA2}$ is supplied from the adder 135-1 or 135-2 to the multiplier 232. Control then goes to step S33.

The multiplier 232 multiplies the calculated sum from the adder 135-1 or 135-2 by "$-h^{-1}$", and supplies the product to the arithmetic unit 141. Then, control goes to step S34. In step S34, the register 142 supplies the parity symbols stored therein in step S36, to described later on, to the multiplier 241, which multiplies the parity symbols by "i". The parity symbols as multiplied by "i" are supplied to the arithmetic unit 141. Thereafter, control goes to step S35.

In step S35, the arithmetic unit 141 calculates the sum on $F_q$ of the parity symbols as multiplied by "$-h^{-1}$" for the row to be processed and the parity symbols multiplied by "i" by the multiplier 241, determining new parity symbols. The arithmetic unit 141 supplies the determined parity symbols to the register 142. Then, control goes to step S36. In step S36, the register 142 stores the supplied parity symbols. Then, control goes to step S37 in which the register 142 outputs the supplied parity symbols through the switch 138 with the terminal P selected as code symbols $c_u$ to the subsequent stage. Thereafter, control goes to step S38.

In step S38, the controller 131 determines whether the time t25 is reached based on the clock incorporated therein and all code symbols $c_u$ have been output or not. If the controller 131 judges that the time t25 is not reached and all code symbols $c_u$ have not been output, then control goes back to step S32, and the processing from step S32 is repeated. If the controller 131 judges in step S38 that the time t25 is reached and all code symbols $c_u$ have been output, then the encoding process is put to an end.

The code symbols are output in the order of code symbols $c_{16}, c_{17}, c_{18}, c_{19}, c_{20}, c_{21}, c_{22}, c_{23}, c_{24}, c_{25}$ to the subsequent stage. The encoding apparatus 221 finally determines 10 parity symbols, and combines the 15 information symbols and the 10 parity symbols, thereby generating a 25-symbol IRA-type quasi-cyclic code. The encoding apparatus 221 thus encodes information into an IRA-type quasi-cyclic code, using the parity-check matrix $H_{QCIRA2}$.

Since the information part 201 of the parity-check matrix $H_{QCIRA2}$ is represented by quasi-cyclic matrixes, and the sum of the values corresponding to the nonzero elements in the rows of the information part 201 of the parity-check matrix $H_{QCIRA2}$ is simply determined using shift registers, new parity symbols can be determined by calculating the sum on $F_q$ of, i.e., exclusive-ORing, the determined sum of the values corresponding to the nonzero elements in the rows and the parity symbols determined in the immediately previous cycle.

The encoding apparatus 221 does not employ an expensive random interleaver, but is of a less costly and simple arrangement as it employs simple shift registers.

FIG. 11 shows still another parity-check matrix $H_{QCIRA3}$ for encoding data into IRA-type quasi-cyclic codes according to the present invention. The parity-check matrix $H_{QCIRA3}$ shown in FIG. 11 is another example of the parity-check matrix $H_{QCIRA2}$ shown in FIG. 8, will not be described in detail to avoid a repetitive description.

In FIG. 11, the parity-check matrix $H_{QCIRA3}$ is a parity-check matrix for encoding information having an information length k=15 into an IRA-type quasi-cyclic code having a code length n=25 and expressed by a cyclic square matrix having a size m, a code length n=n0×m, an information length k=k0× m, l:=(code length n−information length k)/m=n0−k0 (in FIG. 11, n=25, k=15, m=5, n0=5, k0=3, l=2). In the parity-check matrix $H_{QCIRA3}$, a, b, c, d, e, f, g, h, i, j, o, p, r, s, t, z ∈ $F_q$, and h and z represent invertible elements ($h \cdot h^{-1} = z \cdot z^{-1} = 0$).

The parity-check matrix $H_{QCIRA3}$ has 10 (rows)×25 (columns) elements. The parity-check matrix $H_{QCIRA3}$ includes an information part 301 having elements represented by the information length k (15) and a parity part 302 having elements represented by code length n−information length k (10). The information part 301 is of an arrangement identical to the information part 201 of the parity-check matrix $H_{QCIRA2}$ shown in FIG. 8. That is, the information part 301 includes a 2 (rows)×3 (columns) quasi-cyclic matrix having, as elements, a matrix $HI_{11}$, a matrix $HI_{12}$, a matrix $HI_{13}$, a matrix $HI_{21}$, a matrix $HI_{22}$, and a matrix $HI_{23}$ (matrixes $HI_{xy}$, ($1 \leq x < 2$), ($1 \leq y \leq 3$), each being a cyclic square matrix having 5 (rows)×5 (columns) elements.

Therefore, each of the horizontal arrays of the rows in the upper block (matrixes $HI_{1y}$ ($1 \leq y \leq 3$)) of the information part 301 is made up of seven nonzero elements and eight zero elements "0", and each row of each of the matrixes $HI_{1y}$ is produced by shifting, to the right, the values of the immediately above row by one position. Each of the horizontal arrays of the rows in the lower block (matrixes $HI_{2y}$ ($1 \leq y \leq 3$)) of the information part 301 is made up of six nonzero elements and nine zero elements "0", and each row of each of the matrixes $HI_{2y}$ is produced by shifting, to the right, the values of the immediately above row by one position. Stated otherwise, the values of each row of each of the matrixes $HI_{xy}$ of the information part 301 are produced by cyclically shifting the values of the immediately above row.

The parity part 302 is rendered cyclic while maintaining the properties of a parity-check matrix for IRA codes. The parity part 302 includes a matrix such as a 2 (rows)×2 (columns) quasi-cyclic matrix having, as elements, a matrix $HP_{11}$, a matrix $HP_{12}$, a matrix $HP_{21}$, and a matrix $HP_{22}$, each having 5 (rows)×5 (columns) elements. The parity-check matrix $H_{QCIRA3}$ may be changed to a matrix which is the same as the parity-check matrix $H_{QCIRA2}$ shown in FIG. 8 by setting h=z and switching around rows and columns in the parity part 302. If h=z, then the parity-check matrix $H_{QCIRA3}$ is of the same value as the parity-check matrix $H_{QCIRA2}$ shown in FIG. 8.

The matrix $HP_{11}$ of the parity part 302 includes a 5×5 cyclic square matrix having a first row of "h0000", a second row of "0h000", a third row of "00h00", a fourth row of "000h0", and a fifth row of "0000h". The matrix $HP_{12}$ of the parity part 302 includes a 5×5 square matrix having a first row of "00000", a second row of "i0000", a third row of "0i000", a fourth row of "00i00", and a fifth row of "000i0". The matrix $HP_{21}$ of the parity part 302 includes a 5×5 cyclic square matrix having a first row of "i0000", a second row of "0i000", a third row of "00i00", a fourth row of "000i0", and a fifth row of "0000i". The matrix $HP_{22}$ of the parity part 302 includes a 5×5 cyclic square matrix having a first row of "z0000", a second row of "0z000", a third row of "00z00", a fourth row of "000z0", and a fifth row of "0000z".

In each of the matrixes $HP_{11}$, $HP_{12}$, $HP_{21}$, $HP_{22}$, each row is produced by shifting, to the right, the values of the immediately above row by one position. That is, the values of each row in each of the matrixes HP of the parity part 302 are produced by cyclically shifting the values of the immediately above row.

As described above, the parity-check matrix $H_{QCIRA3}$ for IRA-type quasi-cyclic codes has the information part 301 made up of zero elements and nonzero elements arranged in an arbitrary pattern and the parity part 302 having nonzero elements arranged in a step-like pattern and zero elements placed as remaining entries, as with a parity-check matrix for IRA codes. The information part 301 of the parity-check matrix $H_{QCIRA3}$ has cyclic matrixes as elements, as with a parity-check matrix for quasi-cyclic codes, and the parity part 302 of the parity-check matrix $H_{QCIRA3}$ is arranged so as to be cyclic.

Figure 12:
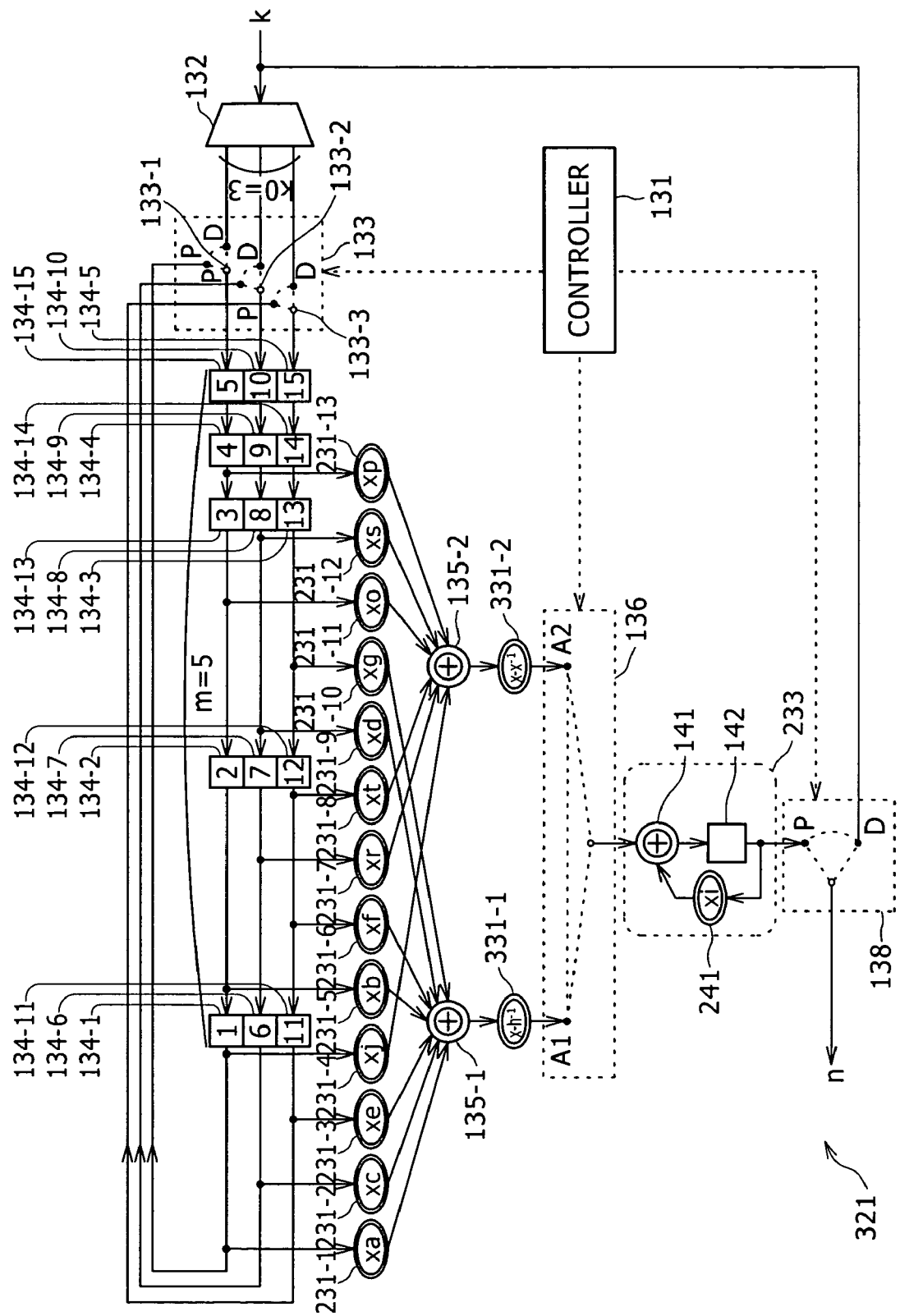
FIG. 12 is a block diagram of still another encoding apparatus for encoding data into IRA-type quasi-cyclic codes according to the present invention.

FIG. 12 shows in block form an encoding apparatus 321 for encoding data into IRA-type quasi-cyclic codes according to the present invention. The encoding apparatus 321 shown in FIG. 12 is essentially of the same arrangement as the encoding apparatus 221 shown in FIG. 9 except that the multiplier 232 is dispensed with and multipliers 331-1 and 331-2 are added. Therefore, the encoding apparatus 321 will not be described in detail below to avoid a repetitive description.

The encoding apparatus 321 shown in FIG. 12 encodes input data (information symbols) into an IRA-type quasi-cyclic code according to the parity-check matrix $H_{QCIRA3}$ shown in FIG. 11, and outputs the encoded data as code symbols. It is assumed that information symbols corresponding to uth rows ($1 \leq u \leq 15$) of the matrixes $HI_{xy}$ in the information part 301 of the parity-check matrix $H_{QCIRA3}$ are represented by $m_u$ and code symbols output from the encoding apparatus 321 are represented by $c_u$ ($1 \leq u \leq 25$). The encoding apparatus 321 is supplied with information symbols $m_1, m_2, m_3, \ldots, m_{15}$ at respective times t1 through t15.

In FIG. 12, a controller 131 performs a timing process based on a clock incorporated therein, and sets (changes) switches 133, 136, and 138 to terminals according to the parity-check matrix $H_{QCIRA3}$. Specifically, at the times t1 through t15, the controller 131 sets the switch 133 to terminals D, storing the supplied information symbols $m_u$ in the registers 134-1 through 134-15, and sets the switch 138 to the terminal D, outputting the supplied information symbols $m_u$ directly as code symbols $c_u$ to the subsequent stage. At times t16 through t25, the controller 131 sets the switch 133 to terminals P, cyclically shifting the information symbols $m_u$ stored in the registers 134-1 through 134-15, and sets the switch 138 to a terminal P, outputting parity symbols calculated in the encoding apparatus 321 as code symbols $c_u$ to the subsequent stage.

At the times t16, t18, t20, t22, t24, the controller 131 sets the switch 136 to the terminal A1, supplying a calculated result from an adder 135-1 to an arithmetic unit 141. At the times t17, t19, t21, t23, t25, the controller 131 sets the switch 136 to a terminal A2, supplying a calculated result from an adder 135-2 to the arithmetic unit 141. The code symbols are thus output in the order of code symbols $c_{16}, c_{21}, C_{17}, c_{22}, c_{18}, c_{23}, c_{19}, c_{24}, c_{20}, c_{25}$ to the subsequent stage.

A separator 132 separates the serially input information symbols $m_u$ into three parallel sequences of information symbols so that information symbols $m_u$ will be stored in the corresponding registers 134-1 through 134-15, and supplies the separated information symbols $m_u$ to the switch 133.

When the switches 133-1 through 133-3 are set to the terminals D by the controller 131, they store the information symbols $m_u$ from the separator 132 into the respective registers 134-1 through 134-15, and when the switches 133-1 through 133-3 are set to the terminals P by the controller 131, they cyclically shift the information symbols $m_u$ stored in the registers 134-1 through 134-15 through the three loops. The registers 134-1 through 134-15 include shift registers, and store the information symbols $m_u$ input thereto. The registers 134-1 through 134-15 are divided into groups to provide three loops each having five registers, i.e., groups having registers 134-1 through 134-5, registers 134-6 through 134-10, and registers 134-11 through 134-15, respectively.

The adders 135-1, 135-2 are connected to the registers 134-1 through 134-15 through the multipliers 231-1 through 231-13 such that the adders 135-1, 135-2 are supplied with the values depending on the nonzero elements in the rows of the information part 301 of the parity-check matrix $H_{QCIRA3}$. The number of the multipliers 231-1 through 231-13 is determined by the number of nonzero elements in the upper and lower blocks of the information part 301.

When supplied with the values depending on the nonzero elements in the rows, the adders 135-1, 135-2 calculates the sum on $F_q$ of the supplied values. The multiplier 331-1 is connected between the adder 135-1 and the switch 136, and multiplies the calculated sum from the adder 135-1 by "$-h^{-1}$". The multiplier 331-2 is connected between the adder 135-2 and the switch 136, and multiplies the calculated sum from the adder 135-2 by "$-z^{-1}$". The multipliers 331-1, 331-2 will also be referred to as multipliers 331 if they do not need to be individually separated.

The switch 136 has the terminal A1 connected to the multiplier 331-1 and the terminal A2 connected to the multiplier 331-2. The switch 136 is controlled by the controller 131 to supply the accumulator 233 with the calculated result for the rows as multiplied by the multiplier 331 that is connected to the selected terminal of the switch 136. Specifically, when the switch 136 is connected to the terminal A1, the switch 136 outputs the calculated result for the rows as multiplied by "$-h^{-1}$" by the multiplier 331-1 to the accumulator 233, and when the switch 136 is connected to the terminal A2, the switch 136 outputs the calculated result for the rows as multiplied by "$-z^{-1}$" by the multiplier 331-2 to the accumulator 233.

The accumulator 233 includes an arithmetic unit 141, a register 142, and a multiplier 241. The arithmetic unit 141 calculates the sum on $F_q$ of the product from the switch 136 and the parity symbols from the register 142 as multiplied by "i" by the multiplier 241, thereby determining new parity symbols, and supplies the determined parity symbols to the register 142. The register 142 includes a shift register, for example, and stores the parity symbols from the arithmetic unit 141, supplies the stored parity symbols to the arithmetic unit 141 through the multiplier 241, and also outputs the stored parity symbols as code symbols $c_{16}, c_{21}, c_{17}, c_{22}, c_{18}, c_{23}, c_{19}, c_{24}, c_{20}, c_{25}$ through the switch 138 with the terminal P selected to the subsequent stage. The multiplier 241 multiplies the parity symbols from the register 142 by "i", and supplies the product to the arithmetic unit 141.

Figure 13:
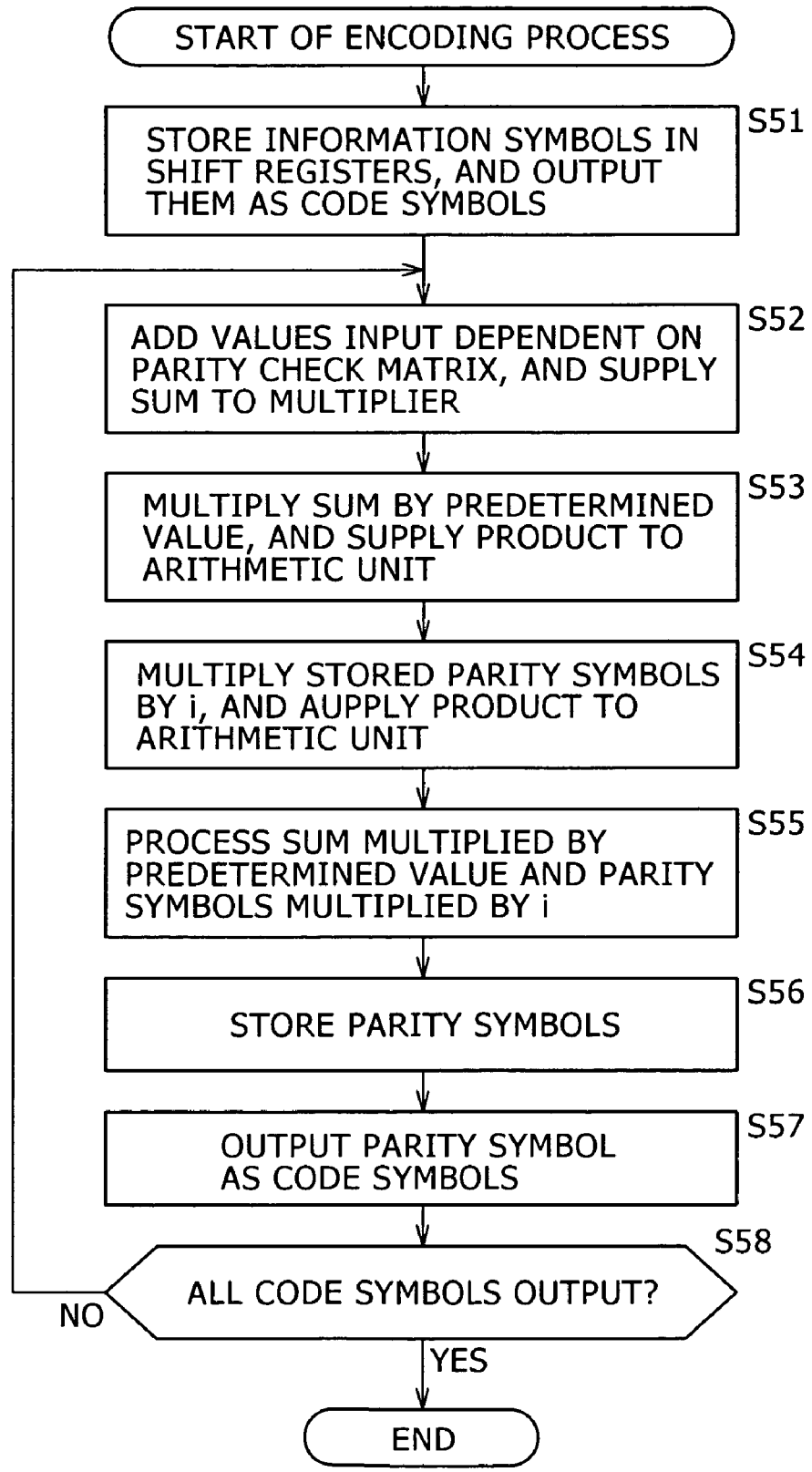
FIG. 13 is a flowchart of an encoding process performed by the encoding apparatus shown in FIG. 12.

An encoding process performed by the encoding apparatus 321 will be described in detail below with reference to FIG. 13. Steps S51 and S54 through S58 shown in FIG. 13 are identical to steps S31 and S34 through S38 shown in FIG. 10, and will not be described in detail below to avoid a repetitive description.

It is assumed that information symbols corresponding to uth rows ($1 \leq u \leq 15$) of the matrixes $HI_{xy}$ in the information part 301 of the parity-check matrix $H_{QCIRA3}$ are represented by $m_u$ and code symbols output from the encoding apparatus 321 are represented by $c_u$ ($1 \leq u \leq 25$). The separator 132 is supplied with information symbols $m_1, m_2, m_3, \ldots, m_{15}$ at respective times t1 through t15.

In step S51, the controller 131 sets the switch 133 to the terminals D, storing the supplied information symbols $m_1, m_2, m_3, \ldots, m_{15}$ in the registers 134-1 through 134-15, and also sets the switch 138 to the terminal D, outputting the supplied information symbols $m_1, m_2, m_3, \ldots, m_{15}$ as code symbols $c_1=m_1, c_2=m_2, c_3=m_3, \ldots, c_{15}=m_{15}$ to the subsequent stage. Then, control goes to step S52.

If the controller 131 judges that the time t16 is reached based on the clock incorporated therein, then the controller 131 sets the switches 133, 138 to the terminals P in step S52, and sets the switch 136 depending on the parity-check matrix $H_{QCIRA3}$ in step S53, after which control goes to step S54. In step S52, the adders 135 are supplied with values depending on the parity-check matrix $H_{QCIRA3}$, and calculate the sum on $F_q$ of the supplied values, and supply the calculated sum to one of the multipliers 331. In step S53, the sum from the adder 135 is multiplied by the multiplier 331, which supplies the product to the arithmetic unit 141.

The processing of steps S52, S53 will be described in greater detail below. The controller 131 starts cyclically shifting the information symbols $m_u$ stored in the registers 134-1 through 134-15. When the switch 133-1 is set to the terminal P, the information symbols stored in the registers 134-1 through 134-15 start being cyclically shifted through the three loops described above with reference to FIG. 7.

As described above with reference to FIG. 11, the adders 135-1, 135-2 are connected to the registers 134-1 through 134-15 through the multipliers 231-1 through 231-13 such that the adders 135-1, 135-2 are supplied with the values depending on the nonzero elements in the rows of the information part 301 of the parity-check matrix $H_{QCIRA3}$. When the information symbols start being cyclically shifted through the loops, the adder 135-1 is supplied with the values depending on the nonzero elements in the rows of the upper block ($HI_{1y}$ ($1 \leq y \leq 3$)) of the information part 301 of the parity-check matrix $H_{QCIRA3}$. The adder 135-1 calculates the sum on $F_q$ of the supplied values, and supplies the calculated sum to the multiplier 331-1, which multiplies the sum by "$-h^{-1}$".

The adder 135-2 is supplied with the values depending on the nonzero elements in the rows of the lower block ($HI_{2b}$ ($1 \leq b \leq 3$)) of the information part 301 of the parity-check matrix $H_{QCIRA3}$. The adder 135-2 calculates the sum on $F_q$ of the supplied values, and supplies the calculated sum to the multiplier 331-2, which multiplies the sum by "$-z^{-1}$".

At the times t16, t18, t20, t22, t24, the controller 131 sets the switch 136 to the terminal A1, supplying the calculated result, as multiplied by "$-h^{-1}$", from the adder 135-1 to the arithmetic unit 141. At the times t17, t19, t21, t23, t25, the controller 131 sets the switch 136 to the terminal A2, supplying the calculated result, as multiplied by "$-z^{-1}$", from the adder 135-2 to the arithmetic unit 141.

At the time t16, for example, the values (a·$m_1$, b·$m_2$, c·$m_6$, d·$m_8$, e·$m_{11}$, $f_{m12}$, g·$m_{13}$) corresponding to the first row of the information part 301 of the parity-check matrix $H_{QCIRA3}$ are supplied to the adder 135-1, which calculates the sum on $F_q$ of the supplied values corresponding to the first row of the information part 301 of the parity-check matrix $H_{QCIRA3}$, and supplies the calculated sum, i.e., the sum on $F_2$ of the values depending on the nonzero elements in the first row of the information part 301 of the parity-check matrix $H_{QCIRA3}$, to the multiplier 331-1. The multiplier 331-1 multiplies the sum supplied from the adder 135-1 by "$-h^{-1}$". At this time, since the switch 136 is set to the terminal A1, the calculated result for the first row of the information part 301, as multiplied by "$-h^{-1}$" by the multiplier 331-1, is supplied through the switch 136 to the arithmetic unit 141.

At the time t17, for example, the values (j·$m_1$, o·$m_3$, p·$m_4$, r·$m_7$, s·$m_8$, t·$m_{12}$) corresponding to the sixth row of the information part 301 of the parity-check matrix $H_{QCIRA3}$ are supplied to the adder 135-2, which calculates the sum on $F_q$ of the supplied values corresponding to the sixth row of the information part 301 of the parity-check matrix $H_{QCIRA3}$, and supplies the calculated sum to the multiplier 331-2. The multiplier 331-2 multiplies the sum supplied from the adder 135-2 by "$-z^{-1}$". At this time, since the switch 136 is set to the terminal A2, the calculated result for the sixth row of the information part 301, as multiplied by "$-z^{-1}$" by the multiplier 331-2, is supplied through the switch 136 to the arithmetic unit 141.

At the time t18, for example, the values (a·$m_2$, b·$m_3$, c·$m_7$, d·$m_9$, e·$m_{12}$, f·$m_{13}$, g·$m_{14}$) corresponding to the second row of the information part 301 of the parity-check matrix $H_{QCIRA3}$ are supplied to the adder 135-1, which calculates the sum on $F_q$ of the supplied values corresponding to the second row of the information part 301 of the parity-check matrix $H_{QCIRA3}$, and supplies the calculated sum to the multiplier 331-1. The multiplier 331-1 multiplies the sum supplied from the adder 135-1 by "$-h^{-1}$". At this time, since the switch 136 is set to the terminal A1, the calculated result for the second row of the information part 301, as multiplied by "$-h^{-1}$" by the multiplier 331-1, is supplied through the switch 136 to the arithmetic unit 141.

At the time t19, for example, the values (j·$m_2$, o·$m_4$, p·$m_5$, r·$m_8$, s·$m_9$, t·$m_{13}$) corresponding to the seventh row of the information part 301 of the parity-check matrix $H_{QCIRA3}$ are supplied to the adder 135-2, which calculates the sum on $F_q$ of the supplied values corresponding to the seventh row of the information part 301 of the parity-check matrix $H_{QCIRA3}$, and supplies the calculated sum to the multiplier 331-2. The multiplier 331-2 multiplies the sum supplied from the adder 135-2 by "$-z^{-1}$". At this time, since the switch 136 is set to the terminal A2, the calculated result for the seventh row of the information part 301, as multiplied by "$-z^{-1}$" by the multiplier 331-2, is supplied through the switch 136 to the arithmetic unit 141.

The same processing as described above is performed at the times t20 through t25, supplying the calculated result for the row to be processed of the information part 301, as multiplied by "$-h^{-1}$" by the multiplier 331-1, or the calculated result for the row to be processed of the information part 301, as multiplied by "$-z^{-1}$" by the multiplier 331-2, through the switch 136 to the arithmetic unit 141.

As described above, in steps S52, S53, the calculated result for the row to be processed of the information part 301, from the adder 135-1 or 135-2, is multiplied by the multiplier 331-1 or 331-2, and the product is supplied to the arithmetic unit 141. Thereafter, control goes to step S54.

In step S54, the register 142 supplies the parity symbols stored therein in step S56, to described later on, to the multiplier 241, which multiplies the parity symbols by "i". The parity symbols as multiplied by "i" are supplied to the arithmetic unit 141. Thereafter, control goes to step S55.

In step S55, the arithmetic unit 141 calculates the sum on $F_q$ of the calculated result as multiplied by the multiplier 232 for the row to be processed and the parity symbols multiplied by "i" by the multiplier 241, determining new parity symbols. The arithmetic unit 141 supplies the determined parity symbols to the register 142. Then, control goes to step S56. In step S56, the register 142 stores the supplied parity symbols. Then, control goes to step S57 in which the register 142 outputs the supplied parity symbols through the switch 138 with the terminal P selected as code symbols $c_u$ to the subsequent stage. Thereafter, control goes to step S58.

In step S58, the controller 131 determines whether the time t25 is reached based on the clock incorporated therein and all code symbols $c_u$ have been output or not. If the controller 131 judges that the time t25 is not reached and all code symbols $c_u$ have not been output, then control goes back to step S52, and the processing from step S52 is repeated. If the controller 131 judges in step S58 that the time t25 is reached and all code symbols $c_u$ have been output, then the encoding process is put to an end.

The code symbols are output in the order of code symbols $c_{16}$, $c_{21}$, $c_{17}$, $c_{22}$, $c_{18}$, $c_{23}$, $c_{19}$, $c_{24}$, $c_{20}$, $c_{25}$ to the subsequent stage. The encoding apparatus 321 finally determines 10 parity symbols, and combines the 15 information symbols and the 10 parity symbols, thereby generating a 25-symbol IRA-type quasi-cyclic code. The encoding apparatus 321 thus encodes information into an IRA-type quasi-cyclic code, using the parity-check matrix $H_{QCIRA3}$.

Since the information part 301 of the parity-check matrix $H_{QCIRA3}$ is represented by quasi-cyclic matrixes, and the sum of the values corresponding to the nonzero elements in the rows of the information part 301 of the parity-check matrix $H_{QCIRA3}$ is simply determined using shift registers, new parity symbols can be determined by calculating the sum on $F_q$ of, i.e., exclusive-ORing, the determined sum of the values corresponding to the nonzero elements in the rows and the parity symbols determined in the immediately previous cycle.

The encoding apparatus 321 does not employ an expensive random interleaver, but is of a less costly and simple arrangement as it employs simple shift registers.

Figure 14:
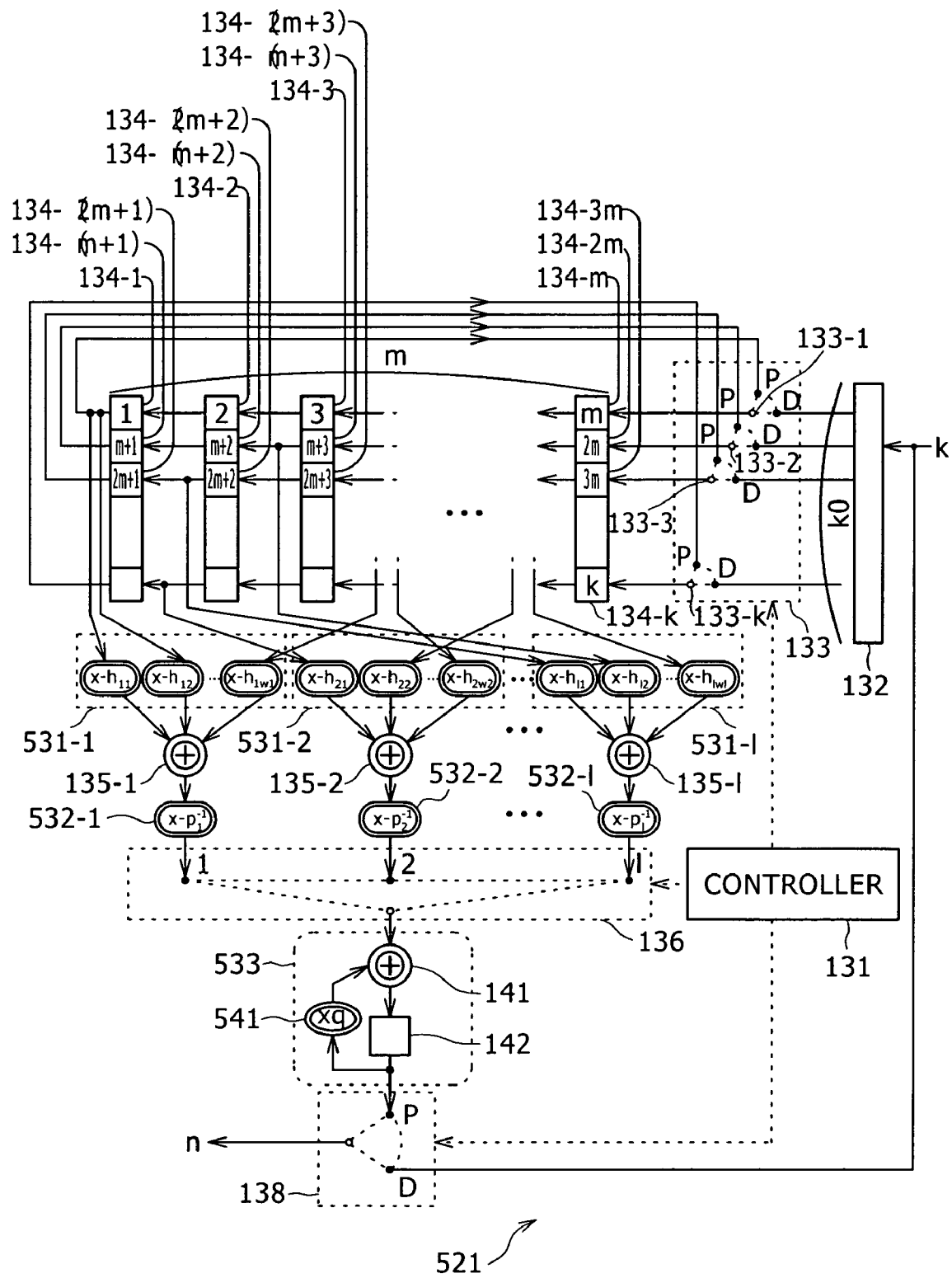
FIG. 14 is a block diagram of yet another encoding apparatus for encoding data into IRA-type quasi-cyclic codes according to the present invention.

FIG. 14 shows in block form yet another encoding apparatus 521 for encoding data into IRA-type quasi-cyclic codes according to the present invention. The encoding apparatus 521 shown in FIG. 14 is a combination of the encoding apparatus 121 shown in FIG. 6, the encoding apparatus 221 shown in FIG. 9, and the encoding apparatus 321 shown in FIG. 12, and will not be described in detail to avoid a repetitive description.

The encoding apparatus 521 shown in FIG. 14 is an encoding apparatus for encoding information into an IRA-type quasi-cyclic code on a finite field F (q=$p^s$, p: prime number, s: natural number), expressed by an information length k, a code length n, and cyclic square matrixes having a size m, n=n0×m, k=k0×m, l:=(code length n−information length k)/m=n0−k0.

The encoding apparatus 521 encodes input data (information having the information length k) into an IRA-type quasi-cyclic code using a parity-check matrix H and outputs the IRA-type quasi-cyclic code as a code having the code length n. Thus, the encoding apparatus 521 is supplied with the information having the information length k and outputs the code having the code length n.

In FIG. 14, a controller 131 performs a timing process based on a clock incorporated therein, and sets (changes) switches 133, 136, and 138 to terminals according to the parity-check matrix H. A separator 132 separates the serially input information into k0 parallel sequences of information so that the information will be stored in corresponding registers 134-1 through 134-k, and supplies the separated information to the switch 133.

When switches 133-1 through 133-k0 are set to terminals D by the controller 131, they store the information from the separator 132 into the registers 134-1 through 134-k. When the switches 133-1 through 133-k0 are set to terminals P by the controller 131, they cyclically shift the information stored in the registers 134-1 through 134-k through k0 loops.

The registers 134-1 through 134-k include as many shift registers as the information length k, and store the information input thereto. The registers 134-1 through 134-k are divided into groups each having m registers, i.e., groups having registers 134-1 through 134-m, registers 134-(m+1) through 134-2m, and registers 134-(2m+1) through 134-3m, . . . , respectively, to provide the k0 loops.

Adders 135-1 through 135-l are connected to the registers 134-1 through 134-k through multipliers 531-1 through 531-l such that the adders 135-1, 135-2 are supplied with the values depending on the nonzero elements in the rows of the information part of the parity-check matrix H. The number of the multipliers 531-1 through 531-l is dependent on the number of nonzero elements in the rows of the information part of the parity-check matrix H. The multipliers 531-1 through 531-l multiply the information from the registers 134-1 through 134-k by a predetermined value, and supply the product to the adders 135-1 through 135-l connected thereto. Specifically, the multipliers 531-1 through 531-l include w1 multipliers 531-1 for multiplying the values corresponding to the nonzero elements in the uppermost row of the information part of the parity-check matrix H by "$h_{11}$", "$h_{12}$", . . . , "$h_{1w1}$", w2 multipliers 531-2 for multiplying the values corresponding to the nonzero elements in the second row, from above, of the information part of the parity-check matrix H by "$h_{21}$", "$h_{22}$", . . . , "$h_{2w2}$", and wl multipliers 531-l for multiplying the values corresponding to the nonzero elements in the first row, from above, of the information part of the parity-check matrix H by "$h_{l1}$", "$h_{l2}$", "$h_{lwl}$"($h_{11}$, $h_{12}$, $h_{1w1}$, $h_{21}$, $h_{22}$, $h_{2w2}$, $h_{l1}$, $h_{l2}$, $h_{lwl} \in F_q$). In FIG. 12, the multipliers 531-1 through 531-l are denoted as w1 multipliers 531-1, w2 multipliers 531-2, . . . , wl multipliers 531-l.

There are as many adders 135-1 through 135-l as the number of rows (l=n0−k0) of the information part of the parity-check matrix H which has matrixes of the information part as elements. When supplied with the values depending on the nonzero elements in the rows, the adders 135-1 through 135-l calculates the sum on $F_q$ of the supplied values. Multipliers 531-1 through 531-l are connected between the adders 135-1 through 135-l and the switch 136, and multiply the calculated sums from the adders 135 by predetermined values. Specifically, the multiplier 532-1 multiplies the calculated sum from the adder 135-1 by "$-p_1^{-1}$", the multiplier 532-2 multiplies the calculated sum from the adder 135-2 by "$-p_2^{-1}$", and the multiplier 532-l multiplies the calculated sum from the adder 135-l by "$-p_l^{-1}$" ($p_1$, $p_2$, $p_l \in F_q$).

The switch 136 has a terminal A1 connected to the multiplier 532-1, a terminal A2 connected to the multiplier 532-2, . . . , and a terminal Al connected to the multiplier 532-l. The switch 136 is controlled by the controller 131 to output the calculated result for the rows as multiplied by the multiplier 532 connected to the selected terminal to an accumulator 533. Specifically, when the switch 136 is set to the terminal A1, the switch 136 outputs the calculated result for the rows as multiplied by "$-p_l^{-1}$" by the multiplier 532-1 to the accumulator 533. When the switch 136 is set to the terminal A2, the switch 136 outputs the calculated result for the rows as multiplied by "$-p_2^{-1}$" by the multiplier 532-2 to the accumulator 533. When the switch 136 is set to the terminal Al, the switch 136 outputs the calculated result for the rows as multiplied by "$-p_l^{-1}$" by the multiplier 532-l to the accumulator 533.

The accumulator 533 is of the same arrangement as the accumulator 233 shown in FIG. 9, and includes an arithmetic unit 141, a register 142, and a multiplier 541. The arithmetic unit 141 calculates the sum on $F_q$ of the multiplied result from the switch 136 and the parity values from the register 142 as multiplied by "i" by the multiplier 241, thereby determining new parity values, and supplies the determined parity values to the register 142. The register 142 includes a shift register, for example, and stores the parity values from the arithmetic unit 141, supplies the stored parity values, as multiplied by "q" by the multiplier 541, to the arithmetic unit 141, and also outputs the stored parity values as a code through the switch 138 with the terminal P selected to the subsequent stage. The multiplier 541 multiplies the parity values from the register 142 by "q", and supplies the product to the arithmetic unit 141 (q $\in F_q$).

An encoding process performed by the encoding apparatus 521 is identical to either one of the encoding processes described above with reference to FIGS. 7, 11, and 13, and will not be described in detail to avoid a repetitive description. The encoding apparatus 521 finally determines 10 parity values, and the 15 information values and the 10 parity values, generating a 25-bit IRA-type quasi-cyclic code.

According to the present invention, as described above, since the information part of the parity-check matrix H for IRA-type quasi-cyclic codes is represented by quasi-cyclic matrixes, and the parity values of the information part of the parity-check matrix H is simply determined using shift registers, new parity values can be determined by calculating the sum on $F_q$ of, i.e., exclusive-ORing, the determined parity values and the parity values determined in the immediately previous cycle.

The encoding apparatus does not employ an expensive random interleaver, but is of a less costly and simple arrangement as it employs simple shift registers.

In the above description, the number of values input to the adders 135 is dependent on the nonzero elements in the rows of the information part of the parity-check matrix H. therefore, if a parity-check matrix having a lower density is used, i.e., if codes are LDPC (Low Density Parity Check) codes, then the number of input values is reduced, allowing data to be encoded at a lower cost.

While a finite field $F_q$ has been described as a linear space for codes, the present invention is also applicable to any ring R.

The steps indicated in the illustrated flowcharts include not only steps that are executed chronologically in a described sequence, but also steps that are executed parallel or individually, rather than chronologically.

Although certain preferred embodiments of the present invention have been shown and described in detail, it should be understood that various changes and modifications may be made therein without departing from the scope of the appended claims.

What is claimed is:

1. An apparatus for encoding data into linear codes on a ring R, comprising:
    as many shift registers as the length of information input thereto, said shift registers having a plurality of memory elements;
    a shift adding unit for adding values which are cyclically input depending on a check matrix for said linear codes, from said shift registers;
    a storage unit for storing parity values of said linear codes; and
    an accumulative adding unit for adding a sum from said shift adding unit and the parity values of said linear codes stored in said storage unit to each other to determine new parity values of said linear codes, and supplying the new parity values to said storage unit.

2. An apparatus according to claim 1, wherein said check matrix for said linear codes is of a low density.

3. An apparatus according to claim 1, wherein said ring R comprises a finite field having elements represented by a power of a prime number.

4. An apparatus according to claim 1, further comprising:
    a selecting unit for selecting the sum from said shift adding unit depending on the check matrix for said linear codes;
    wherein said accumulative adding unit adds the sum selected by said selecting unit and the parity values of said linear codes stored in said storage unit to each other to determine the new parity values of said linear codes, and supplies the new parity values to said storage unit.

5. A method of encoding data into linear codes on a ring R, comprising the steps of:
    adding values which are cyclically input depending on a check matrix for said linear codes from as many shift registers as the length of information input thereto, said shift registers having a plurality of memory elements;
    storing parity values of said linear codes in a storage unit; and
    accumulatively adding a sum from said adding step and the parity values of said linear codes stored in said storage unit to each other to determine new parity values of said linear codes, and supplying the new parity values to said storage unit.

6. A method according to claim 5, wherein said check matrix for said linear codes is of a low density.

7. A method according to claim 5, wherein said ring R comprises a finite field having elements represented by a power of a prime number.

8. A method according to claim 5, further comprising the step of:
    selecting the sum from said adding step depending on the check matrix for said linear codes;
    wherein said accumulatively adding step adds the sum selected by said selecting step and the parity values of said linear codes stored in said storage unit to each other to determine the new parity values of said linear codes, and supplies the new parity values to said storage unit.

* * * * *